(12) United States Patent
Gardner et al.

(10) Patent No.: US 7,385,671 B2
(45) Date of Patent: Jun. 10, 2008

(54) HIGH SPEED LITHOGRAPHY MACHINE AND METHOD

(75) Inventors: Steven D. Gardner, Westford, MA (US); Elvino M. da Silveira, North Andover, MA (US); Griffith L. Resor, III, Acton, MA (US)

(73) Assignee: Azores Corporation, Wilmington, MA (US)

( * ) Notice: Subject to any disclaimer, the term of this patent is extended or adjusted under 35 U.S.C. 154(b) by 52 days.

(21) Appl. No.: 10/856,700

(22) Filed: May 28, 2004

(65) Prior Publication Data

US 2005/0264777 A1   Dec. 1, 2005

(51) Int. Cl.
*G03B 27/42* (2006.01)

(52) U.S. Cl. .......................................... 355/53; 356/401

(58) Field of Classification Search .................. 355/53, 355/67, 72, 75, 46; 356/399–401, 490–508
See application file for complete search history.

(56) References Cited

U.S. PATENT DOCUMENTS

| | | | |
|---|---|---|---|
| 3,434,787 A | | 3/1969 | Chitayat |
| 3,495,512 A | | 2/1970 | Vaughan |
| 3,498,711 A | | 3/1970 | Ables et al. |
| 3,539,256 A | | 11/1970 | Ables et al. |
| 3,544,213 A | | 12/1970 | Jaeger et al. |
| 3,563,648 A | | 2/1971 | Baggaley et al. |
| 4,473,293 A | | 9/1984 | Phillips |
| 4,631,416 A | * | 12/1986 | Trutna, Jr. .................. 250/548 |
| 4,668,089 A | | 5/1987 | Oshida et al. |
| 4,769,680 A | | 9/1988 | Resor et al. |
| RE33,836 E | | 3/1992 | Resor, III et al. |
| 5,621,813 A | | 4/1997 | Brown et al. |
| 5,633,755 A | * | 5/1997 | Manabe et al. ............. 359/443 |
| 5,677,758 A | | 10/1997 | McEachern et al. |
| 5,757,160 A | | 5/1998 | Kreuzer |
| 5,828,142 A | | 10/1998 | Simpson |
| 5,933,216 A | * | 8/1999 | Dunn .......................... 355/53 |
| 5,969,441 A | | 10/1999 | Loopstra et al. |
| 6,166,392 A | | 12/2000 | Chang et al. |
| 6,171,736 B1 | * | 1/2001 | Hirayanagi ................... 430/22 |
| 6,238,852 B1 | * | 5/2001 | Klosner ...................... 430/396 |
| 6,341,007 B1 | | 1/2002 | Nishi et al. |

(Continued)

FOREIGN PATENT DOCUMENTS

EP   0 341 848 B1   1/1995

(Continued)

*Primary Examiner*—D. Rutledge
(74) *Attorney, Agent, or Firm*—Hamilton, Brook, Smith & Reynolds, P.C.

(57) ABSTRACT

A machine and method for high speed production of circuit patterns on silicon wafers or similar substrates may be used for applications including printing Integrated Circuit (IC) packaging patterns onto wafers prior to separating IC chips. Projection camera(s) simultaneously project image(s) onto substrate(s) carried on an X, Y, θ stage. The projection camera(s) may include independent alignment systems, light sources, and control of focus, image placement, image size, and dose. In one embodiment, each camera includes a 6-axis reticle chuck that moves a reticle to correct image-to-substrate overlay errors. In-stage metrology sensors and machine software establish and maintain the correct relationship among the machine's coordinate systems. Thus, two or more projection cameras can print simultaneously even when substrates are slightly misplaced on the X, Y, θ stage.

102 Claims, 11 Drawing Sheets

FRONT VIEW

U.S. PATENT DOCUMENTS

| | | | |
|---|---|---|---|
| 6,525,804 B1 * | 2/2003 | Tanaka ........................ | 355/53 |
| 2003/0218730 A1 * | 11/2003 | Murakami et al. ............ | 355/53 |
| 2004/0026634 A1 * | 2/2004 | Utsumi et al. ......... | 250/492.23 |
| 2004/0043311 A1 | 3/2004 | McCullough et al. | |

FOREIGN PATENT DOCUMENTS

| | | |
|---|---|---|
| JP | 60-47418 | 3/1985 |
| JP | 63-261850 | 10/1988 |

* cited by examiner

TOP VIEW

TOP VIEW

DIRECT TTL ALIGNMENT

RIGHT SIDE VIEW

STAGE METROLOGY PACKAGE

POSITION TEST RETICLE

RESOLUTION TEST RETICLE

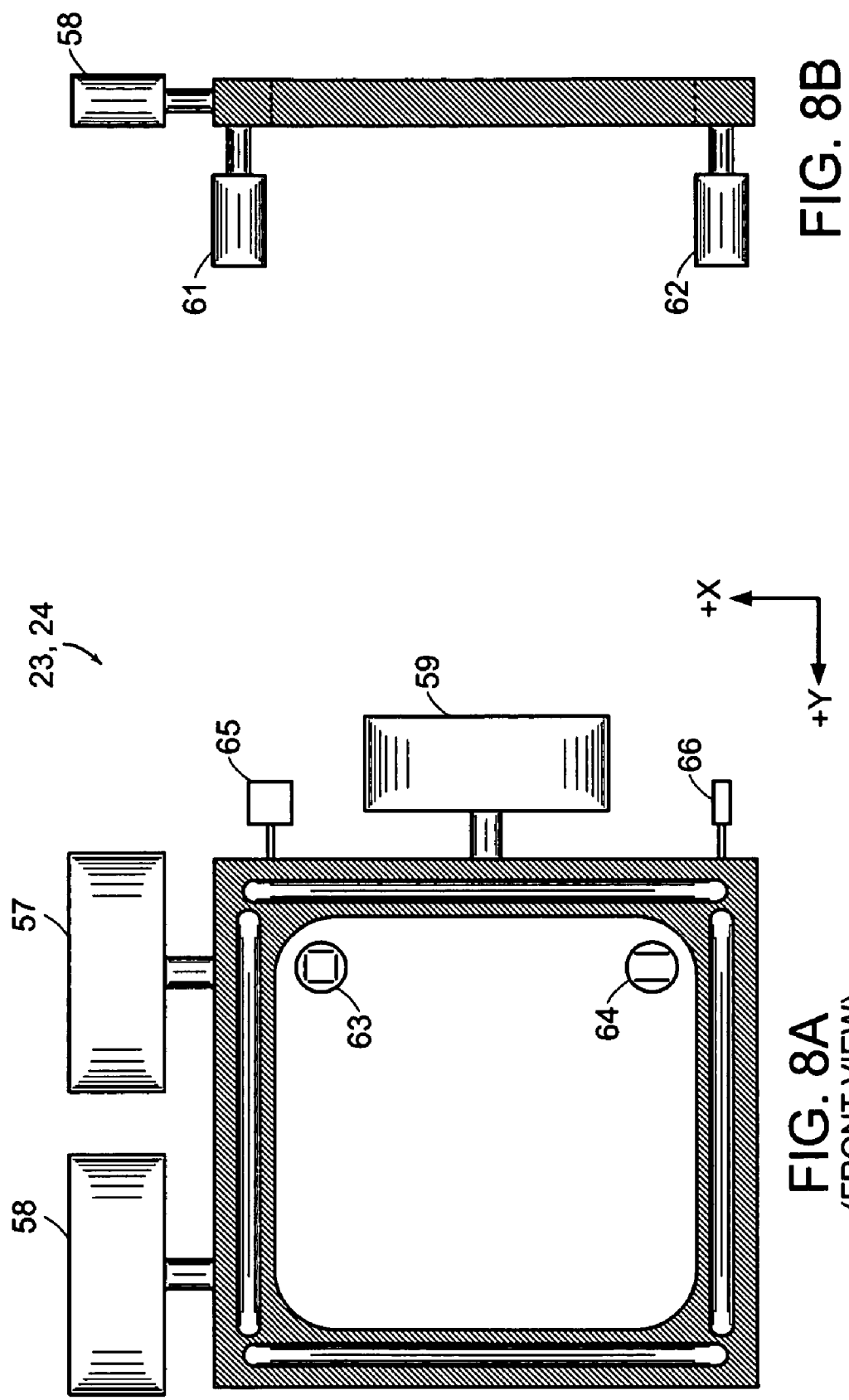

HIGH SPEED LITHOGRAPHY MACHINE AND METHOD

BACKGROUND OF THE INVENTION

Since the early 1960's, semiconductor wafer manufacturing has relied on step-and-repeat imaging to reproduce circuit patterns rapidly and at low cost. In step-and-repeat photolithography machines, a reticle that has one or a few circuit patterns on it is projected onto the semiconductor wafer through a lens. 4× reduction optics have been the most popular, but reductions of 20×, 10×, 5×, 2× and 1× have been used depending on the application. Even a few magnifying projection machines have been built. A substrate, usually a silicon wafer, is moved in a step-and-repeat manner by an X, Y stage. When the stage stops, a shutter is opened, light passes through the reticle and reduction lens, and the reticle image is quickly transferred to a photosensitive film on the substrate. For nearly 40 years, this method has been the most productive way to replicate Integrated Circuit (IC) chip patterns.

Recently, this step-and-repeat technique for imaging circuit patterns on a substrate has found utility in packaging of high density IC chips. At today's density of interconnect and value for one microprocessor chip, high yield projection methods are replacing contact printing as the photocopying method of choice.

SUMMARY OF THE INVENTION

A machine and method according to the principles of the present invention achieve high throughput step-and-repeat lithography. Instead of aligning a substrate to an image source (e.g., reticle having an image to be printed onto the substrate), the image source is aligned to the substrate, which is positioned in a projection region of a projection camera. In high throughput applications, two or more projection cameras are built and controlled in a manner that permits simultaneous alignment to and printing of two or more substrates at one time, even when the individual substrates are not accurately positioned on the main stage.

Accordingly, in one embodiment, a lithography machine, or corresponding method, according to the principles of the present invention includes at least two projection cameras positioned to project images from respective image sources onto at least two substrates simultaneously. The projection cameras include respective, independent, multi-axis alignment systems that align the respective images with the respective substrates. A stage carries the substrates and moves relative to the projection cameras.

The lithography machine may also include a controller that coordinates motion of the images and stage, free from moving the substrates with respect to the stage, to align and overlay the projected images on the substrates from the respective projection cameras. The controller may cause the multi-axis alignment system to compensate for alignment differences between the substrates on the stage. The multi-axis alignment systems may also include (i) independent, multi-axis alignment mechanisms that move the respective images independently relative to the respective substrates to correct for an alignment error between the respective image sources and substrates. Further, the multi-axis alignment systems may also include auto-focus mechanisms that automatically focus the images from the projection cameras independently.

In one embodiment, the multi-axis alignment systems move the image sources in at least two axes to correct for errors, such as X, Y, θ, image size, and keystone errors. Each multi-axis alignment system may also include a position sensor subsystem in each axis of motion. The multi-axis alignment systems may be calibrated prior to being used for projecting images onto the respective substrates, which allows for open- or closed-loop alignment control during printing operations. Each multi-axis alignment system may also include a travel range sufficient to move the projected image at least about +/−1.25 mm on the substrate in the X- and Y-axes to correct for wafer placement errors in X, Y, θ.

The multi-axis alignment systems may also include respective alignment sensors used to determine a position of a substrate on the stage. In one embodiment, the alignment sensors are alignment microscopes.

The multi-axis alignment systems may also include at least one stage metrology package located on the stage in a position observable by the alignment systems. In this embodiment, the alignment systems are adapted to determine alignment between the respective projection cameras and the stage through observation of the stage metrology package(s). The stage metrology package(s) may include multiple patterns observable by the alignment systems, and the stage metrology package(s) may be shared by the multi-axis alignment systems.

The image sources may include a mask or mechanisms that dynamically generate a mask.

The projection cameras may include a shutter controlled by a dose control system to expose the substrates to the images for a controlled amount of time. In a two camera embodiment, the stage remains stationary until the slower of the two shutters closes.

In one implementation, the multi-axis alignment systems include (a) an auto-focus detector, (b) a multi-axis reticle chuck that holds a reticle that includes the image source, and (c) an alignment microscope and camera coupled to image processing software. In this implementation, the multi-axis alignment systems include a focus control mechanism that moves the respective projection camera in an axis to correct for a focus error, as determined by the auto focus detector. The alignment mechanisms also include mechanisms that move the multi-axis reticle chuck in multiple axes to correct for alignment errors, as determined by the image processing software through comparison of current alignment images taken by the alignment microscope and previously determined calibration data associated with the multi-axis reticle chuck.

The multi-axis alignment systems may include voice coils and flexures. Alternatively, the multi-axis alignment mechanism may include ceramic actuators, mechanical amplifiers, and flexures. Further, the multi-axis alignment mechanisms may include a combination of voice coils, ceramic actuators, mechanical amplifiers, or flexures.

The multi-axis alignment systems may include position sensors. The position sensors can be used to improve the accuracy of multi-axis navigation and to achieve high speed positioning. In some cases, these position sensors may be stable but inaccurate prior to calibration. Their accuracy may be improved by built-in machine calibration routines and navigation databases.

The stage may have multiple surfaces that support alignment measurements in at least two axes. The multiple surfaces may be mirrors that reflect optical beams, such as laser beams. In one of the axes, at least two optical beams may be spaced apart approximately at least the same distance as the projection cameras. The stage may be driven by multiple motors, where at least two motors may be driven differentially to rotate the stage.

Another embodiment of the present invention includes a lithography machine, or corresponding method, with one projection camera including a reticle chuck adapted to hold a reticle. The reticle includes a pattern to be projected as an image onto a substrate. A multi-axis alignment system moves the image in multiple directions. A stage is adapted to carry the substrate and to move the substrate relative to the projection camera. An alignment sensor system is adapted to measure a position of the substrate relative to the stage for use in projecting the image onto the substrate. An alignment controller coupled to the alignment sensor system, stage and multi-axis alignment system causes the stage to position the substrate in a projection region of the camera for gross alignment and causes the multi-axis alignment system to align the image relative to the substrate for fine alignment each time the stage moves in the projection region.

Yet another embodiment of the present invention includes a lithography machine, or corresponding method, including at least two projection cameras positioned to project images from respective image sources onto at least two substrates simultaneously. The projection cameras include respective alignment systems. The lithography machine in this embodiment also includes first and second alignment microscopes that detect alignment patterns associated with the respective substrates. At least one alignment compensation controller coupled to outputs of the first and second alignment microscopes causes the alignment systems to move the images relative to the substrates based on the detected alignment patterns received from the alignment microscopes.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 8A is a front view of the 6-axis reticle chuck of FIG. 1.

FIG. 8B is a side view of the 6-axis reticle chuck of FIG. 8A.

DETAILED DESCRIPTION OF THE INVENTION

Figure 1:
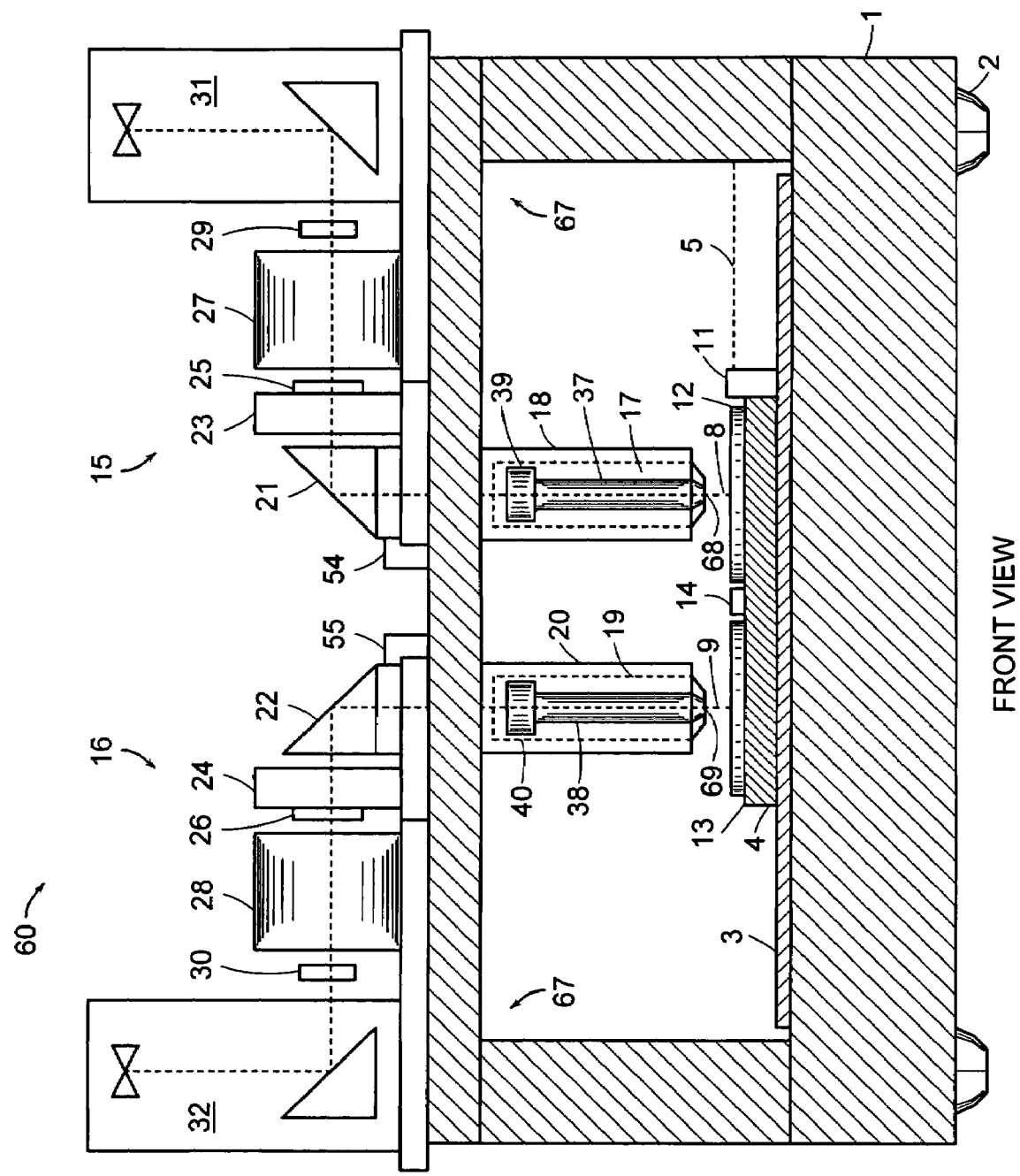
FIG. 1 is a front view of an assembled lithography machine, including two projection systems in position to print two substrates on a single main stage, according to the principles of the present invention.

A description of preferred embodiments of the invention follows.

Step-and-repeat lithography machines are used in semiconductor substrate or wafer printing. In the field of Integrated Circuit (IC) chip packaging, moderate resolution images are aligned and printed onto semiconductor wafers at high speed. Other substrates, such as those used for flat panel displays, can also be printed using a high speed technique.

One embodiment of a lithography machine according to the principles of the present invention can be used in IC chip packaging and flat panel display production. The lithography machine may include two projection cameras, two alignment microscopes, a main X, Y, θ stage adapted to carry two substrates, controllers, position sensors, and alignment mechanisms that allow independent alignment of images projected by the cameras onto the substrates, as described below.

In most cases of a two-wafer machine, the two wafers are not exactly in the correct position to permit printing in parallel without further adjustment of the machine. Each camera has its own autofocus detector and Z-motion so that the gap under each camera lens can be adjusted to focus on wafers of different thickness and flatness. Each projection camera also has a 6-axis chuck that holds a reticle. Each reticle has on it the circuit pattern to be printed. Each 6-axis chuck can be moved under computer control to arbitrary locations above the lens over a range of +/−2.5 mm. The control computer combines the wafer position data gained from the most recent alignment pictures by a respective alignment microscope associated with the prior machine calibration data to determine the correct motion of the 6-axis reticle chuck. Open or closed-loop control can be employed to align each reticle via its reticle chuck and/or each camera. In this manner, images that will be printed through each reduction lens are shifted into the proper location to fit to the actual wafer location found at alignment.

The 6-axis reticle chuck moves in X, Y, and θ to provide good in-plane alignment. It also moves in 3-axes of Z-motion to tune the image size for best fit to each wafer's alignment data. Each projection camera has its own 6-axis reticle chuck, so motion around an average center can be accomplished with each camera's image being moved until it projects onto the correct wafer position below the projection lens. Each lens is designed to have excess field-of-view to permit the reticle and image motion to align images to the existing pattern on a substrate. This excess field-of-view is also well corrected optically, so substantially no errors of focus or position are added by moving the image to correct for wafer position variations.

With the reticles in position, the shutter in each projection system opens. Individual calibrated dose meters integrate the light flux and shut each shutter when the desired exposure has been determined. Shutter timing varies slightly due to lamp mismatch and aging. When the last shutter closes, the stage moves quickly to the next exposure location and stops. The exposure sequence continues until both substrates are fully exposed. The main X, Y, θ stage on which the substrates are carried in this embodiment then moves to the front of the machine to exchange the substrates with other substrates for exposure to the reticle image.

A rapid adjustment capability that puts projected images in the right place on the substrates depends on reliable and automatic machine calibration. An in-stage metrology sensor package provides the measurement capabilities needed. A machine database stores calibration results for rapid access during substrate processing.

Two types of calibration routines may be used. Simple, fast routines are used to update data and correct the position of the four optical axes (i.e., two cameras, two alignment microscopes) on the machine in X, Y, Z (focus) and θ (rotation). Longer, more complex, calibration routines using the same calibration hardware are used to bring the machine into proper adjustment during its fabrication and again during its installation.

This embodiment describes just two printing cameras working in parallel on two independent, slightly misplaced substrates carried on a single stage. It should be understood that a machine can be built with more than two projection cameras and more than two substrates using the invention disclosed herein. A single alignment microscope and camera could also be used, but would be slower as several more main stage moves would be required. While a 6-axis reticle chuck motion has been described, it should be understood that for some applications a two or three axis reticle chuck motion would be adequate to align images to substrates in the manner described herein.

FIG. 1 is a diagram of a lithography machine 60 according to the principles of the present invention. The lithography machine 60 includes a base 1, which is typically a large block of finished granite that sits on isolation supports 2. The combination of the large mass on the base 1 and the design of the isolation supports 2 provides isolation of the lithography machine 60 from floor vibrations. The isolation supports 2 also prevent machine forces from getting into the factory floor and disturbing nearby machinery. The base 1 and isolation supports 2 may be constructed from common commercial parts.

On top of the base 1 is a large grid motor platen 3, such as one disclosed in U.S. Pat. No. 5,828,142. The large grid motor platen 3 may include a matrix of soft iron teeth of 1 mm square, separated in X and Y directions by a 1 mm gap. The gaps between all teeth are filled with non-magnetic material, usually epoxy. This surface is ground very flat, to tolerances of a few microns, to provide an air bearing quality surface. Flatness is also useful to control tip and tilt of a main X, Y, θ stage 4 (hereafter referred to as the main stage 4), a possible source of Abbé offset errors in a stage interferometer system.

The area covered by the grid motor platen 3 is large enough to allow the main stage 4 to move to all required positions. The travel area allows movement to a substrate exchange position (at the machine front), to substrate alignment location(s), to all calibration locations, and throughout an exposure area. The travel area for the embodiment described herein is about 1.3 meters×1.0 meters.

The main stage 4 has within its body four forcer motors (not shown). These motors are arranged to drive the stage across the grid motor platen 3. Two motors are oriented to drive the main stage 4 in an X-axis ("X") direction. Two additional motors are oriented at 90° to drive the main stage 4 in a Y-axis ("Y") direction. Either or both pairs of motors may be driven differentially to provide small rotation motion (θ). In this manner, the main stage 4 may be controlled to move in a very straight line even though the tooth pattern in the grid motor platen 3 may not be straight.

Figure 2:
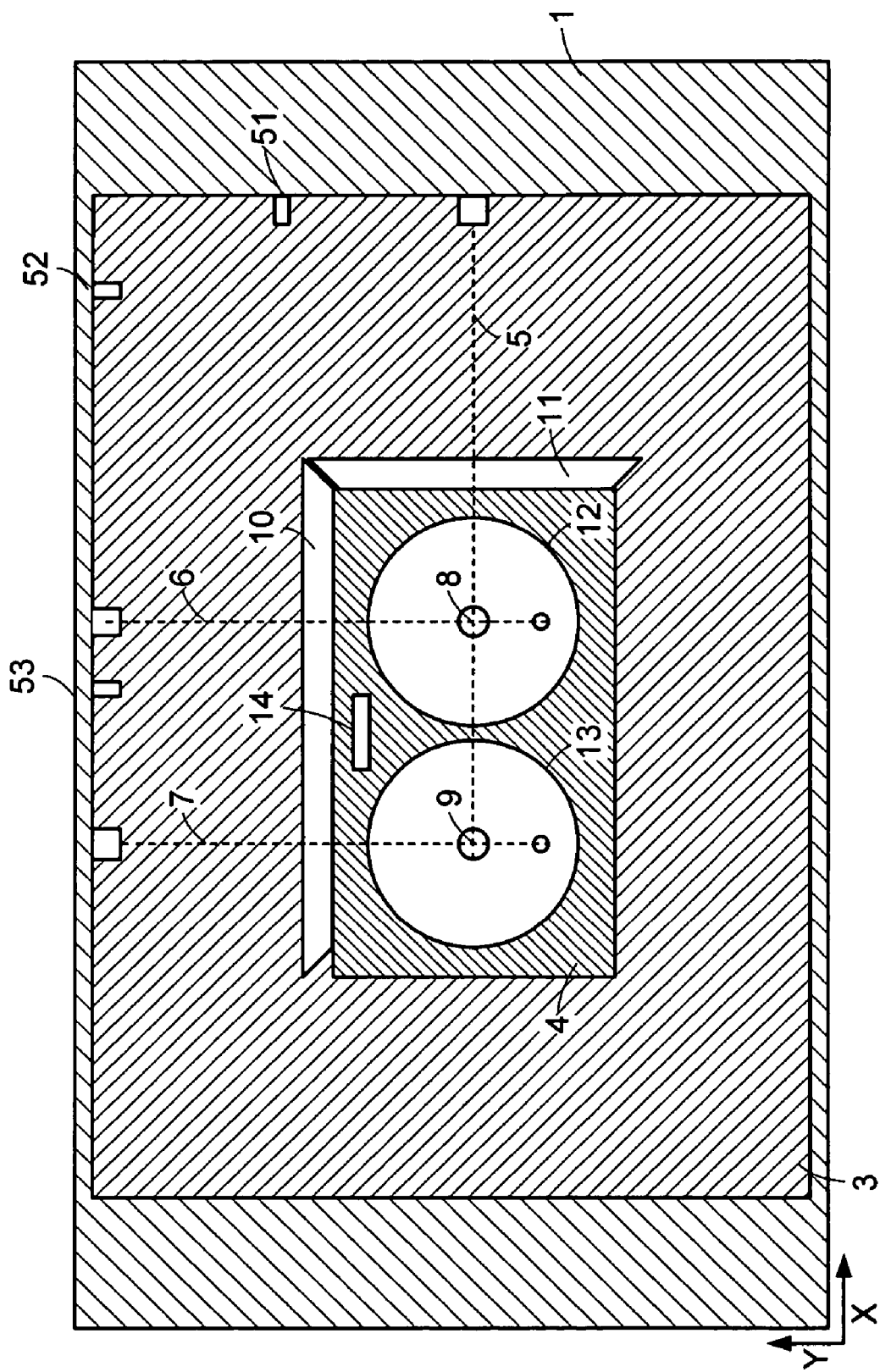
FIG. 2 is a top view of the lithography machine of FIG. 1 showing the layout of the main stage on a large grid motor platen, and three axes of interferometer control, and the optical axis of each projection lens and each alignment microscope.

A commercial laser interferometer system is used to measure the exact location of the main stage 4 in three axes and provide feedback to the main stage motor controls. Three interferometer laser beams are used in this embodiment. An X-axis laser beam 5 is shown in FIG. 1 at the right side of the main stage 4. Two Y-axis laser beams 6 and 7 are behind the main stage 4, as shown in FIG. 2. In one embodiment, the two Y-axis laser beams 6 and 7 are spaced as far apart as the machine layout permits to gain the best possible control of stage rotation (yaw). Note that small stage rotation errors cause a stepping distance at a right projection axis 8 and at a left projection axis 9 (FIG. 1) to be slightly different. FIG. 2 shows the preferred embodiment, with the two Y-axis laser beams 6 and 7 in-line with their respective projection axes 8 and 9. As a practical matter, an exact coincidence with the printing optical axes is not required.

Continuing to refer to FIG. 2, a Y stage mirror 10 is preferably very flat since not only does its flatness error add directly to Y position and machine-to-machine overlay errors, but its flatness error also introduces small yaw errors. For example, if the flatness error in the Y stage mirror 10 is 0.1-micrometer, and if this occurs exactly across the separation distance of the two laser beams in the Y-axis, then the interferometer sees this as a yaw error of the main stage 4. Through a stage control system, this error will be corrected, rotating main stage 4 with respect to the projection systems. If the separation of the two Y-axis laser beams 6 and 7 is 200 mm while the two projection axes 8 and 9 are separated by 400 mm, then a 0.2-micrometer positioning error arises. Accordingly, the beam separation, the printing camera separation, and the Y stage mirror 10 flatness are preferably designed as a subsystem to achieve the desired overlay result.

It should be understood that alternative measuring instruments other than a laser interferometer may be used to determine stage position and rotation. For example, glass scales may be deployed on the main stage 4 and a "through-the-lens" (TTL) alignment may be done at each site. Other measurement instruments may be employed such as resolvers or optical encoders.

A right stage mirror 11 controls stepping position in the X-axis. Its lack of flatness contributes directly to position and machine-to-machine overlay errors. The right stage mirror 11 is also very flat, generally 0.1-micrometer or better. The actual tolerance depends on the printing application and its machine-to-machine overlay tolerance.

In this embodiment, the forcer motors in the main stage 4 have flat gas bearing surfaces built into their bottom surfaces. When the gas or air bearings (not shown) are pressurized, the main stage 4 lifts about 10-micrometers above the grid motor platen 3 surface. The magnetic forces in the forcer motors preload each air bearing so that a very stiff support is achieved. Once the main stage 4 is airborne, it is free to move around the grid motor platen 3 without friction. This permits very fast and accurate positioning of the main stage 4.

In this embodiment, the main stage 4 is patterned on its top surface to hold two substrates, generally round silicon wafers. The top surface of the main stage 4 is optically flat, with relief patterns to reduce the impact of random dirt particles and to provide vacuum clamping of each substrate individually. In this manner, each substrate is held very flat and in a stable location on the main stage 4. This arrangement provides a robust main stage design at a low cost. Adjusting for the inevitable variation of substrate positioning on the main stage 4 is provided elsewhere in the machine, as is described below.

Continuing to refer to FIG. 2, the main stage 4 carries on its top surface the right substrate 12 and the left substrate 13. As indicated above, these substrates are preferably directly mounted to the top surface of the main stage 4. It is common to use individual X, Y, θ fine stages under a substrate. Fine stages are used to move a substrate into the desired alignment location. But, such fine stages introduce serious stability problems and overlay errors. Their flexible structure also severely limits stage stepping and settling times. As substrates get larger, the problems caused by a fine stage increase significantly. Therefore, unless a fine stage can be stabilized and stiffened to operate in the environment described herein, mounting the right substrate 12 and left substrate 13 directly to the main stage 4 is preferable to avoid the above-listed problems.

Figure 3A:
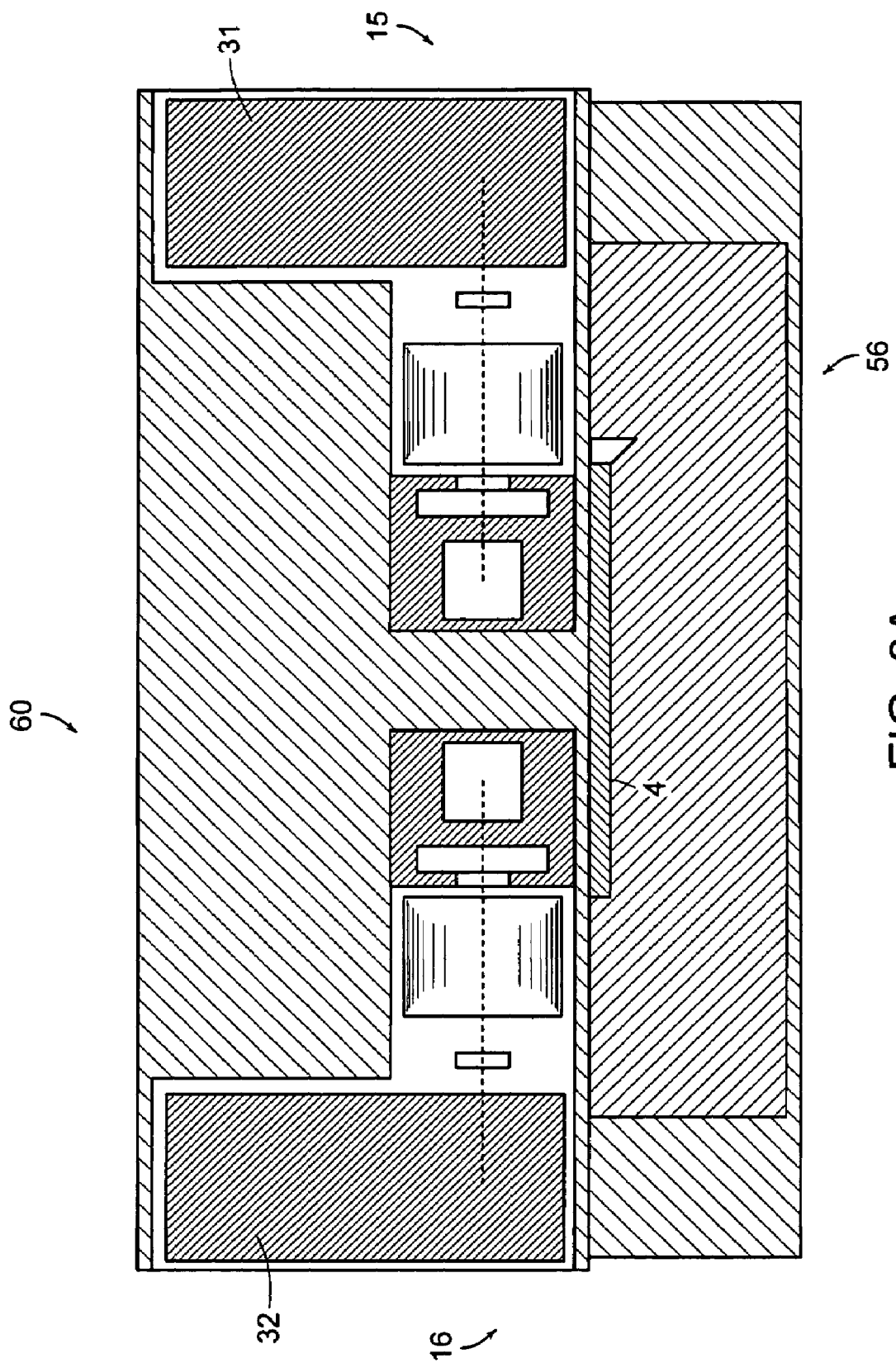
FIG. 3A is another top view of the lithography machine of FIG. 1 showing the layout of two projection cameras above the main stage and grid motor platen of FIG. 2.

Referring to FIG. 3A, during an exchange of substrates, the main stage 4 moves to a loading area 56 at the front of the machine 60. The clamping stage vacuums (not shown) are turned off. Separate lift mechanisms within the stage 4 lift each substrate 12, 13 so that conventional robotic handling paddles (not shown) can reach under each substrate and remove them. In a similar fashion, two new substrates are loaded onto the stage 4. These may be loaded one by one, but a faster parallel loading system may also be employed. The machine design permits parallel loading of substrates using any of several commercially available robotic systems.

Prior to loading, substrates are roughly located in X, Y, θ space, so that when the robotic system puts them onto the main stage 4, their location does not vary by more than +/−0.5 mm. This pre-alignment is accomplished using commercial techniques that are generally well known. Once two substrates are loaded onto the main stage 4, they are clamped by the stage vacuum described above. The stage 4 then moves back under projection cameras (discussed below) to a final alignment position, where final alignment data is gathered.

Figure 3B:
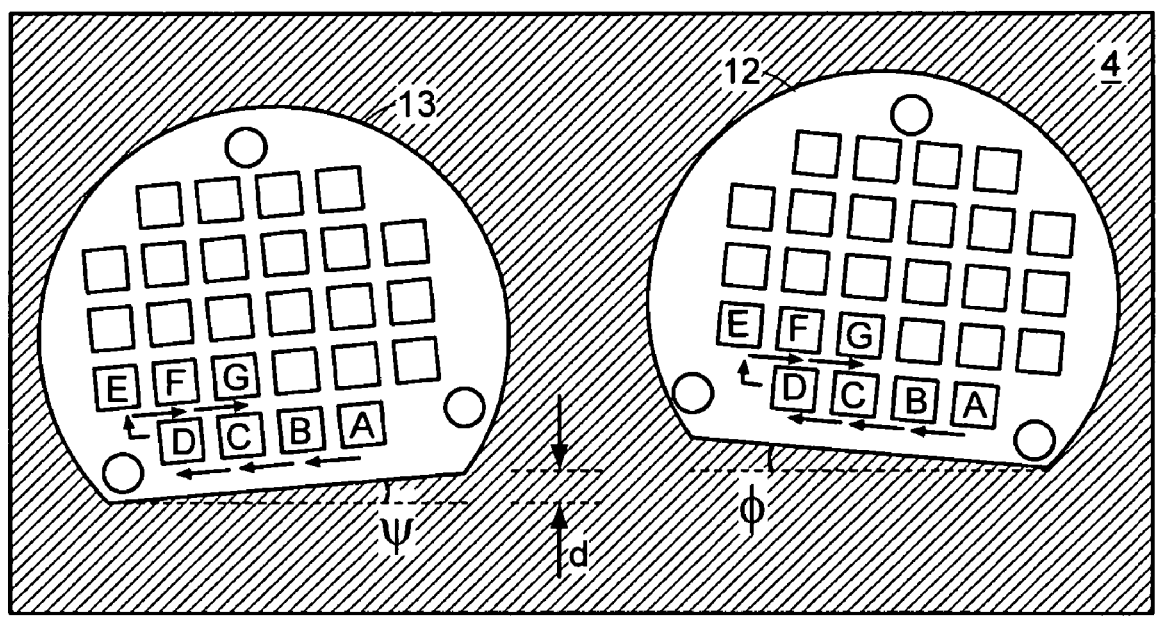
FIG. 3B is a top view of the two substrates on the single main stage of FIG. 3A.

FIG. 3B is a top view of the main stage 4 with the substrates 12, 13 loaded for printing. In this example, the right substrate 12 is loaded with a clockwise rotation angle, Ø, relative to the X- and Y-axes of the main stage 4, and the left substrate 13 is loaded with a counter-clockwise rotation angle, ψ, relative to the main stage 4. The angles are exaggerated for illustration purposes. Also, a small displacement, d, exists between the bottom, flat edge of the substrates 12, 13. The alignment systems in the projection cameras 15, 16 (discussed below) compensate for the rotations and displacements of the substrates 12, 13 in a manner free from moving the substrates 12, 13 on the main stage 4.

In operation, the main stage 4 carries the right and left substrates 12, 13 into a projection region of the right and left projection cameras 15, 16, respectively. The main stage 4 moves the substrates in the projection region (i.e., moves from position A to positions B, C, D, E, F, G, and so forth). Alternatively, the main stage 4 may remain still in the projections region, and the reticle chucks 23, 24 and/or projections cameras 15, 16 may provide enough travel to move an image to image locations A, B, C, . . . G and so forth. Before, during, or after each move to the image locations, an alignment controller (not shown) causes the reticle chucks 23, 24 to align projected images from the reticles 25, 26 with the substrates 12, 13. The alignment controllers may also cause the projection cameras 15, 16 to focus the projected images onto the substrates 12, 13. In an alternative embodiment, the images may be aligned with the substrates 12, 13 by moving mirrors, lenses or other optical elements instead of the reticles 25, 26 via the reticle chucks 23, 24.

Referring again to FIG. 1, in this embodiment, the main stage 4 also carries a stage metrology package 14. This is located near the center of the main stage 4 in the X-axis (FIG. 1) and near the rear of the main stage 4 in Y-axis (FIG. 2). This location permits travel of the stage metrology package 14 to all four optical axes (i.e., projection cameras 15, 16 and alignment microscopes 37, 38, discussed later in reference to FIGS. 4-6) used in the two projection camera embodiment, without adding unnecessary travel to the main stage 4.

As can be seen in FIG. 1, a stiff bridge structure 67 supports a right projection camera 15 and a left projection camera 16 above the main stage 4. Since the two cameras 15, 16 are substantially the same, only the right projection camera 15 is described below unless otherwise indicated.

The right projection camera 15 has a right projection lens 17, of 2× (i.e., two times) reduction, mounted in a right lens housing 18. The right lens housing 18 is mounted on two Z-axis (vertical) air bearings, not shown. These air bearings may be commercially purchased and are preferably a box journal style, which is very stiff. This Z-axis motion is used to move the right lens housing 18 and right projection lens 17 up and down over small distances needed for focus. The right projection lens 17 is telecentric at its image side, so that small changes in focus do not cause image size or image placement errors.

Each projection lens housing (18 and 20) has an individual, real-time, auto-focus sensor (not shown) attached to its bottom. These sensors use simple optics to transform a laser diode light source into a focused slit of light at the substrate 12, 13. Some of the light from this slit reflects off the substrate 12, 13 and is captured by a receiving side of the real-time auto-focus sensor. The reflected slit light is imaged by the receiving optics onto a linear CCD array (not shown). Image processing software is used to locate the image of the reflected slit on the CCD array. Any shift in the position of the image of the reflected slit is then used to control Z-axis drives 54, 55 for projection cameras 15, 16, respectively, until the position of the image on the CCD array is restored. In this manner, the "focus" of each projection camera 15, 16 is maintained at a constant gap. During machine construction, the motion of the Z-axis in micrometers is used to determine the motion of the image on the CCD array in pixel units. This calibration permits conversion of subsequent focus offsets to be implemented as pixel offsets in the Z-axis focus control system.

Attached to the top of the right lens housing 18 is a right fold mirror 21. This mirror 21 puts the remainder of the right projection camera 15 off to the right side. In this embodiment, the right projection lens 17 is designed to have a long working distance at its object side to permit use of the fold mirror 21. The folded optical path makes possible the close spacing of the left projection camera 16. A left fold mirror 22 is similarly attached to the top of the left lens housing 20.

Each projection camera 15, 16 has its own 6-axis reticle chuck 23, 24, which holds a reticle 25, 26 that includes the pattern or mask being imaged onto the respective substrate. The reticles 25, 26 may be referred to as image sources. It should be understood that other devices may also be used as image sources, such as a multi-mirror light valve or an LCD light valve that dynamically generates a mask (i.e, a maskless image source). A right reticle chuck 23 is rigidly attached to the right lens housing 18 so that its mechanical relationship is stable. The right reticle chuck 23 provides 6-axes of very fine, frictionless motion. In other embodiments, the right reticle chuck 23 provides at least two axes of motion to correct for at least one of the following errors: X, Y, θ, image size, or keystone errors.

Referring to FIGS. 8A, X, Y and θ motions of the right reticle chuck 23 and/or right reticle 25 are provided by two vertical voice coils 57 and 58 and one horizontal voice coil drive 59. Another three Z-axis voice coils control motion towards and away from the right projection lens 17. Two of the Z-axis voice coils 61 and 62 are shown in FIG. 8. The three Z-axis voice coils are used to correct for image size and keystone errors, where keystone errors are caused by a tilting alignment error between the reticle and the projection optics. This adjustment is made possible by features designed into the right projection lens 17. In one embodiment, the right projection lens 17 is deliberately not telecentric at its object side so that motion of the right reticle 25 along the optical axis produces a predictable change in image size at the right substrate 12.

In each of the axes of the reticle chuck motion, in one embodiment, an arrangement of flexures (not shown) provides stiff support yet friction-free motion. Each single-axis of motion actually does produce slight cross-axis motion errors in the other five axes, but the flexure design assures these cross-axis terms are small, simple, and stable. In a preferred embodiment, a 6-axis motion calibration routine (described below) is used to determine all cross-axis terms in a 6×6 matrix of terms. Each commanded motion is altered by the 6×6 matrix data, and the result is fed to each of the six voice coils by the 6-axis chuck control system. In this manner, a less-than-perfect motion system is made nearly perfect.

It should be understood that other or additional motion producing drive systems may be employed. For example, ceramic actuators, such as piezo-electric (PZT) actuators, electrostrictive (PMN) actuators, or magnetostrictive actuators, may be used with or without mechanical amplification to move the reticle chucks 23, 24 or reticles 25, 26 in X, Y, and θ. The voice coil motors and/or ceramic actuators (or other drive systems) may be employed in any number of suitable arrangements to produce coarse or fine motions.

Each axis of the 6-axis chuck 23 may have built-in, single-axis, coarse, velocity and position sensors. These coarse sensors (not shown) are used for coarse navigation of the voice coils, for example when moving the chuck to a position where the mask may be automatically loaded or unloaded. Once a mask is loaded, the voice coil coarse motion moves the mask into a position where in-column metrology sensors 63 and 64 can be used. The voice coil servo loop may be switched to use velocity and position feedback from the in-column metrology sensors 63 and 64, use of data from the coarse sensors is temporarily suspended). This fine positioning mode is used to properly locate test masks during calibration (described below). The fine motion of the voice coils, using feedback from the in-column metrology sensors is calibrated as part of the 6-axis motion calibration routine and analytical mathematics. The result is a 6-axis motion system that can be quickly commanded to any position in its range of travel with the required accuracy and repeatability to move reticles over a +/−75 micron range of motion.

A large range of accurate reticle chuck motion (+/−2.5 mm) is useful to align images to substrates that are slightly misplaced on the stage. Non-contact Position Sensing Devices (PSD's) 65 and 66 are provided for this purpose. PSD 65 includes a light emitting diode and a square area of photosensitive silicon that provides an analog output directly proportional to the position of the light spot on the detector active area. As the spot moves in X and/or Y, its velocity and position may be determined and used to provide closed loop servo control of the voice coil motion in X and/or Y over the range of reticle chuck motion used to align images to substrates. PSD 66 provides a second measurement of the Y velocity and position. This is used in conjunction with the Y data from PSD 65 to determine and control rotation motion (θ) of the reticle chuck. In this manner, the X-axis, Y-axis, and θ positions of reticles 25 and 26 can be controlled over the full range of motion used to align images to patterns on slightly misplaced substrates. An additional 6-axis motion calibration routine, described below, assures accurate navigation over the full range of reticle chuck motion. When it is time to move reticles (images) into the desired alignment position, the voice coil servo loops are switched to use velocity and position feedback from the PSD sensors, and feedback from both the in-column metrology sensors and the coarse sensors is temporarily suspended.

In other embodiments, the multi-axis control of one or more reticle chucks may use laser interferometers, glass scales, or differential capacitance sensors for velocity and/or position feedback.

Because reticle chucks 23 and 24 are controlled as just described, they can be used to independently move reticles, and their images, into alignment with substrates 12, 13 that are not quite in the planned location on the main stage 4. Even though voice coil motion is always done in "closed loop" servo fashion, alignment of images to substrates is considered to be done in an "open loop" mode of navigation, since the reticle and image positions are moved "by the numbers" to the correct location. There is no real-time feedback for the proper positioning of the image with respect to prior layers on each substrate.

In one embodiment, the right projection lens 17 has an 80 mm circular field of view, measured at the image (substrate) side. Its reduction ratio is 2×. Approximately +/−1.25 mm of this field is reserved for image motion provided by the 6-axis right reticle chuck 23. In this manner, the right reticle chuck 23 can be used to move images on the right reticle 25 into alignment without having to move either the right substrate 12 or right projection camera 15.

The right reticle chuck 23 holds the right reticle 25 by vacuum clamping, in the preferred embodiment. Alternatively, voice coil drives or ceramic actuators (or other drives) that can operate at the stability and stiffness requirements of the environment may be positioned between the right reticle 25 and right reticle chuck 23. The right reticle 25 has, on the surface nearest to the right projection lens 17, the circuit pattern to be printed.

In one embodiment, lamp houses 31, 32 enclose 3500 watt Hg lamps. These are commercially manufactured custom lamp houses. The light within the lamp house 31 is collected, focused, and filtered, then exits the lamp house 31 near a right shutter 29. When the right shutter 29 is opened, the light continues on through a right condenser lens assembly 27, through the right reticle 25, through right projection lens 17, and exposes the right substrate 12. The right substrate 12 is coated with a photo-sensitive resistive coating commonly used for this purpose. A dose sensor (not shown) is part of the right shutter 29. The dose sensor measures the amount of light coming through the shutter 29. The light is integrated until the commanded dose has been provided. The right shutter 29 is then closed, ending the exposure for one image. Note that normal Hg lamp aging, and small differences from lamp to lamp, causes the shutter closing time to be slightly different between the two projection cameras 15 and 16. In the one stage/two substrate embodiment being described, the control software for the main stage 4 waits for both shutters 29, 30 to close before moving to the next exposure site.

The right condenser lens assembly 27 may be designed to overfill the image field at the right reticle 25. A left condenser lens assembly 28 may be designed in a similar manner. This permits motion of the reticle throughout the +/−2.5 mm of the right reticle chuck 23 motion without altering the illumination properties. A slight amount of overfill may also be provided so that the right lens housing 18 may move up and down for focus correction without altering the illumination. The right projection lens 17 is preferably designed so that de-centering of the illumination system during small focus motions does not impact image quality. In this manner, independent motions for focus of the right projection lens 17 and independent alignment of images from the right reticle 25 are provided.

When the right reticle 25 is first loaded onto the right reticle chuck 23, marks on the right reticle 25 are compared to built-in reticle alignment sensors 63 (top) and 64 (bottom), as shown in FIG. 8A. The top reticle alignment sensor 63 provides X, Y information. The bottom reticle alignment sensor 64 provides additional Y-axis information. From this data, the X, Y, and $\theta$ location of the loaded reticle 25, 26 is determined. The 6-axis chuck then moves the right reticle 25 into a nominal alignment position. The amount of this motion is noted and stored for later navigation use.

Figure 4A:
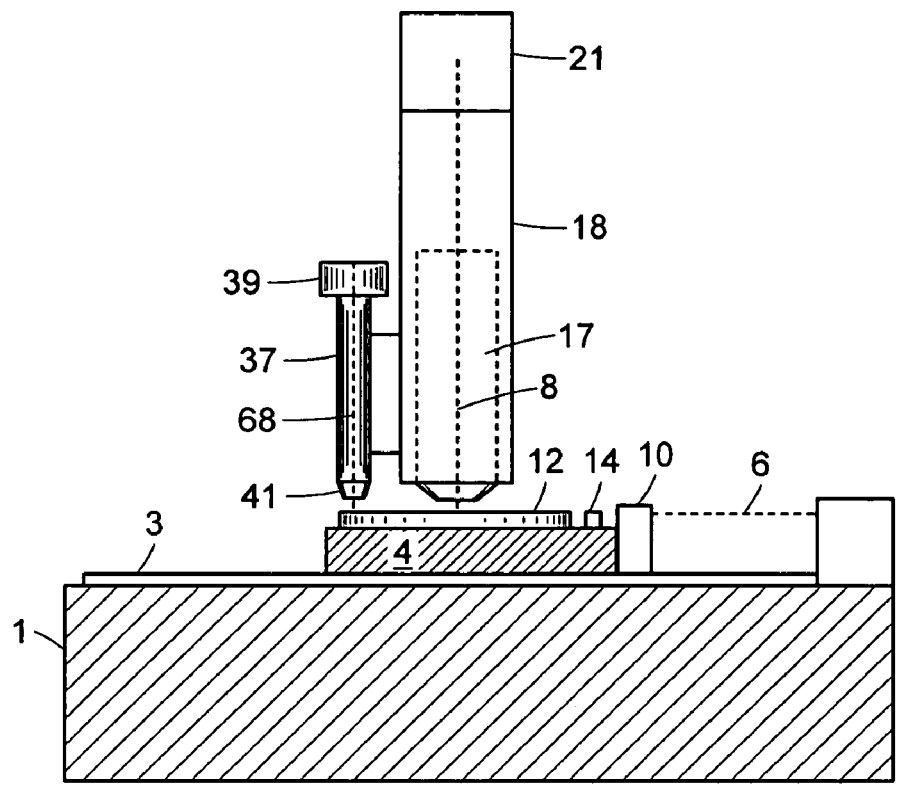
FIG. 4A is a right side view of the lithography machine of FIG. 1 showing part of one of the projection cameras and an associated alignment microscope positioned above a substrate.

Referring now to FIG. 4A, mounted on the right lens housing 18 is a rigidly attached right alignment microscope 37. In one embodiment, this microscope 37 has relatively low magnification. This design provides a large field of view used to capture wafer alignment images. In High Density Interconnect (HDI) applications, substrates 12 arriving at this machine come from many other machines. Precise machine matching cannot be assumed. Consequently, a large image capture range is useful. To obtain high alignment precision, a high resolution, right vision camera 39 is used along with pixel interpolation. The high resolution of the right vision camera 39 also provides better position measurement accuracy by utilizing an inherent grid structure built into an image sensor chip (not shown) in the camera 39. A right microscope objective lens 41 used with the right alignment microscope 37 is telecentric at the substrate side in this embodiment; thus, small changes in focus do not create alignment measurement errors. Note that, in one embodiment, both the right alignment microscope's 37 lens 41 and the right vision camera 39 are state-of-the-art commercial Original Equipment Manufacturer (OEM) parts.

Attached to the bottom of each alignment microscope 37, 38 are two more individual, real-time, auto-focus sensors (not shown), one on each alignment microscope 37, 38. These operate in the same way as the two, individual, auto-focus sensors previously described for the two projection cameras 15, 16. When the main stage 4 moves substrates 12, 13 under their respective alignment microscopes 37, 38, each auto-focus sensor on each alignment microscope 37, 38 measures the error from a "best" focus and commands its projection camera 15, 16 to move in the Z-axis to the best focus position. Note that during machine construction, the best focus position for each alignment microscope 37, 38 is determined and stored in the machine database, for use in operation.

In HDI packaging applications, the silicon wafers already have IC chip patterns on them along with the alignment or fiducial marks used to fabricate the chips. Wafer pre-alignment during substrate loading assures that one wafer alignment mark will appear in each alignment microscope's field-of-view. The alignment marks need not be centered, nor in the same location on each camera 39, 40. Each camera has a calibrated field-of-view (this calibration is described below). So, even though each wafer alignment mark may be misplaced with respect to each alignment camera, reliable position data can be acquired with the fewest possible stage moves and video frame captures. It is not necessary to center wafer alignment marks one by one on each camera 39, 40.

The exact motion sequence during final alignment depends on how many marks are used. The simplest sequence is to move to the nominal location for the first of two marks, acquire the image and location of the first alignment mark, then move the main stage 4 to the nominal location of the second alignment mark and acquire the image and location of the second alignment mark. The main stage 4 then moves under computer control at a calibrated distance from the last alignment mark to the nominal location for the optical axis of each projection camera.

An alternative embodiment is to use only one alignment microscope and add stage moves so that the position of each substrate's alignment marks are measured one-by-one.

It is also possible to construct a system where the alignment is done through the main projection lens 17 and/or 19. In this case, separate off-axis alignment microscopes 37 and 38 may be omitted. With a through-the-lens (TTL) configuration, alignment of images to substrate patterns may be done in a real-time, closed loop manner, or may be done in the "open loop" manner described above.

Figure 4B:
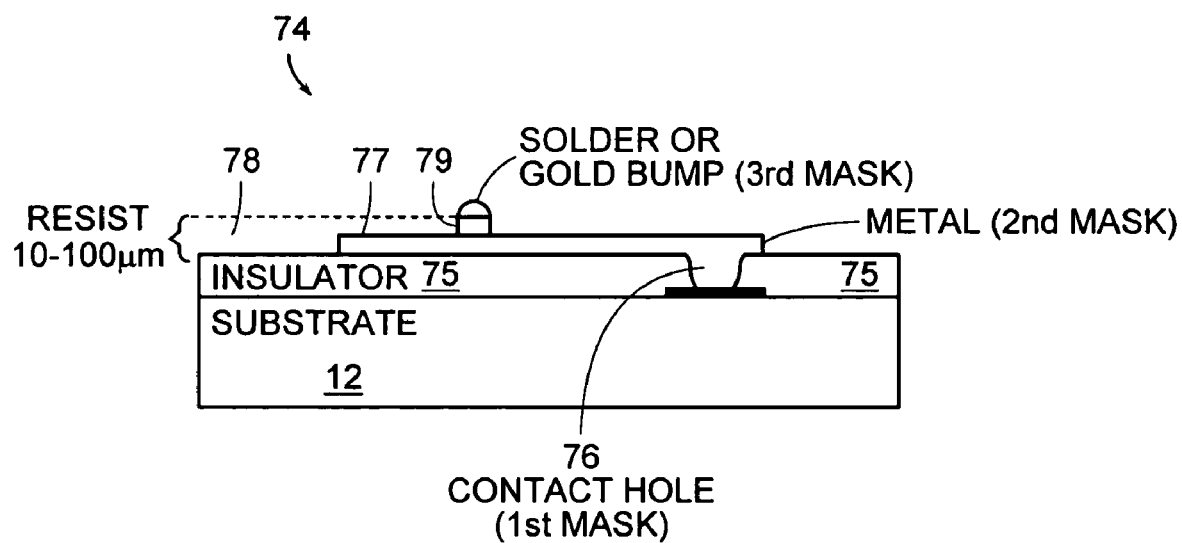
FIG. 4B is a cross-sectional diagram of a multi-layer substrate produced by the lithography machine of FIG. 4A.

FIG. 4B illustrates another example of another precision printing capability by the lithography machine 60. In this example, the lithography machine 60 overlays patterns in a manner that allows for building layers on the substrate 12 to create a multilayer chip 74 ready for packaging in a leaded carrier package (not shown) free from wire bonding processes. On top of the substrate, an insulator 75 is deposited in a process occurring on a different machine. The lithography machine prints a position of a contact hole 76 by way of a first mask (i.e., exposure to a pattern on a reticle 25). A second mask exposes the multi-layer chip 74 to remove a resist layer 78 to define where a metal layer is to be deposited. The multi-layer chip 74 is exposed to a third mask to define where a gold, solder, or other material bump 79 is to be deposited.

The entire lithography machine 60 is preferably housed in a commercial, custom, OEM Class 10 temperature controlled enclosure (not shown). The temperature of machine parts is kept stable to approximately +/−0.1° C. This amount of control is used to stabilize the relationship among the four optical axes of this machine. With such stability, machine calibration can be infrequent, for example, just once a day. The enclosure's particle control assures high yield production.

While the above text describes only the right camera 15, it is to be understood that left camera 16 operates independently, in some embodiments, in the same manner.

Built-in calibration is preferable to making all these above-described independent subsystems work as one well-aligned machine in an automated manner. As described above in referenced to FIGS. 1 and 2, the main X, Y, θ stage 4 holds the stage metrology package 14 on its top rear surface.

Figure 5:
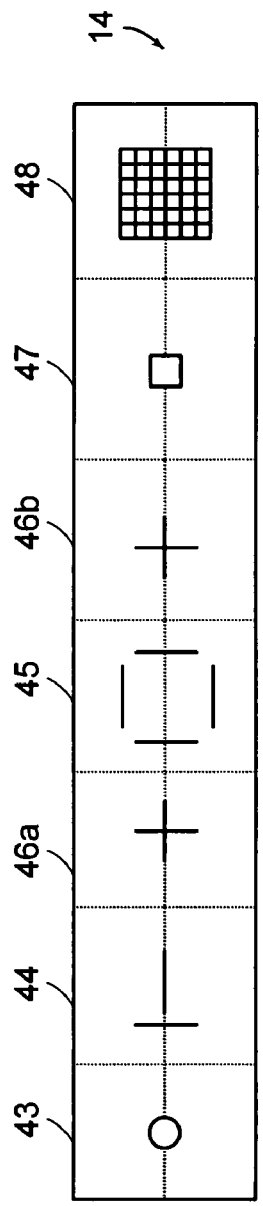
FIG. 5 is a top view of an example stage metrology package having seven sensor patterns used in the lithography machine of FIG. 1.
Figure 7:
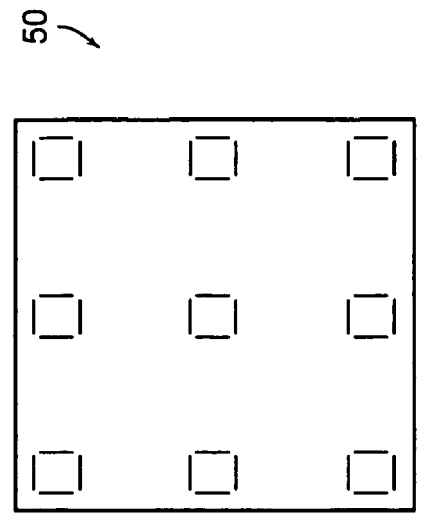
FIG. 7 is a view of the imaging side of a position test reticle (PTR) used in the lithography machine of FIG. 1.

FIG. 5 shows an enlarged top view of the stage metrology package 14. The top surface of the stage metrology package 14 may be a thin glass rectangle with a dense chrome coating. The top surface of the stage metrology package 14 is located at the same height as the nominal top of the substrates 12 and 13. In one embodiment, a hole, various slit patterns, and cross shapes are etched through the dense chrome coating to permit light to pass. Below each such opening are photodiode sensors. In this embodiment, a white reflective region with a less reflective grid pattern is also provided on the top surface of the stage metrology package 14. The use of each of these calibration patterns is explained in greater detail below.

Continuing to refer to FIG. 5, a dose meter 43 has a small opening, typically 1.0 mm in diameter, with a simple photodiode below it. The dose meter 43 serves two purposes. First, it can be moved by the main stage 4 to map the illumination uniformity of each projection camera 15 and 16. The associated software analyzes the data and displays a map of non-uniformity. Numerical results compare the measured performance to the machine specifications and highlight out-of-tolerance conditions. Second, the dose meter 43 may be used to calibrate and match the dose sensors (not shown) in each shutter assembly, such as in the right shutter 29. During machine construction, the dose meter 43 is itself calibrated to a purchased light standard so that the performance of multiple machines may be matched. In this manner, the correct set-up and operation of individual light sources and shutters in each projection camera 15 and 16 is assured.

Figure 6:
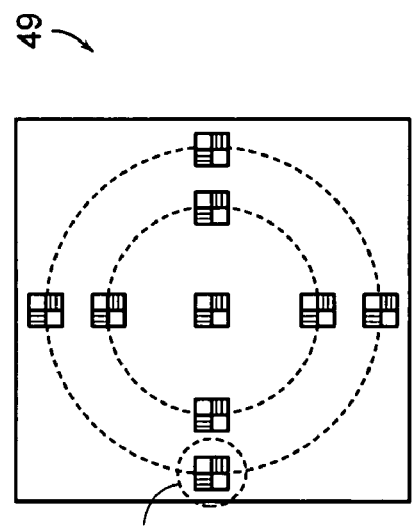
FIG. 6 is a view of the imaging side of a resolution test reticle (RTR) used in the lithography machine of FIG. 1.
Figure 6A:
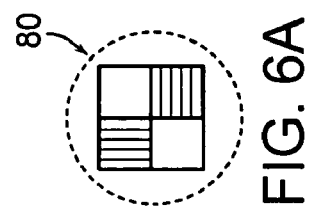
FIG. 6A is a close-up view of a grating on the RTR of FIG. 6.

Image slits 44 are used to find a best focus of each projection lens, such as the right projection lens 17. The stage metrology package 14 has two image slits 44, one in the X-axis and one in the Y-axis. The image slits 44 are typically a few microns wide and a few millimeters long. They operate the same, so only the X-axis slit (short axis in X) is now described. Each image slit 44 works with a companion grating 80 (FIG. 6A) on a special purpose resolution test reticle (RTR) 49 (FIG. 6). Each image slit 44 is scanned slowly at constant velocity in the X-axis until it crosses the aerial image of the companion grating on the RTR 49. A photodetector under the image slit 44 records the amount of light coming through the image slit 44. As the aerial image of the companion grating on the RTR 49 crosses the image slit 44, the signal will modulate. The magnitude of the modulation is recorded and stored for later use. The projection camera 15 or 16 is moved a small step, usually 1-micrometer, in the Z-axis to a new focus setting, and the scan is repeated, recording another scan. The magnitude of the modulation represents an amount of defocus. The Z-axis setting with the highest modulation is selected as the best focus. Since each projection lens has a depth of focus, the change in modulation is not rapid at best focus. A quadratic equation is fit to the data for all modulation values measured, and the maximum is determined by analysis of this equation using normal calculus methods.

In an alternative embodiment, the grating may be a slit and an intensity ratio (i.e., contrast) or other metric may be stored for later use. Various optical effects related to the slit embodiment, such as defocus and aberration, may be predetermined for compensating during operation.

The best focus may be later checked using more conventional line and space patterns on a reticle. These patterns are printed into photosensitive film on a substrate, and the images are developed then examined under a laboratory microscope. By careful observation, the best focus can be determined. This may be a slightly different Z-value from the best focus determined using the image slits 44. The machine software stores and uses the observed offset to correct any subsequent system checks of best focus.

The best focus value in the Z-axis is measured on-axis and at multiple off-axis locations in the image field of the projection lens 17 and/or 19. Using known analysis techniques, the best focus surface for both horizontal and vertical images can be determined. From this data, the best fit focus plane is determined, and maps of astigmatism, focus depth, and focal plane deviation are provided. To speed up daily calibration, the offset of best focus on-axis from the best fit plane is stored in the machine database for later use. In this manner, the optimum setup of each lens' focus is first determined, and it is not necessary to repeat this complex data collection routine.

Continuing to refer to FIG. 5, a position sensor 45 contains two pairs of slits. Each position sensor 45 works with a companion pair of slits on the position test reticle (PTR) 50. A pair of slits is used to determine position, so that position may be accurately determined even when the projection camera 15 is not properly focused and so that some common reticle fabrication errors may be avoided. The position sensor 45 is moved by the main stage 4 to be in rough alignment with the aerial image of the slit pairs from the PTR 50. The signal imbalance is sensed by photodiodes (not shown) under each position sensor 45 slit. The signal imbalance determines the direction of stage motion needed to improve the alignment of position sensor 45 with the aerial image of the slit pairs from the PTR 50 reticle. The PTR 50 slit spacing is slightly different from the position sensor 45 slit spacing. The difference in spacing is set to provide a differential signal, with the signal rising in one of the position sensor 45 slits as the signal drops in the other slit. The X-axis position at which the signals from the photodiodes under the X-slit pair are balanced is considered to be the correct X-axis location of the aerial image from the PTR 50. The same motion and balancing is done in the Y-axis to find the Y-axis location of the aerial image from the PTR 50. In this manner, a very precise but simple determination of image position is made.

The position test reticle 50 has multiple slit-pairs located throughout the image field. These slit-pairs are used to measure and then determine image magnification, keystone error, and radial distortion. The calibration software uses best-fit techniques to determine mean (i.e., average) errors and statistical noise levels. This information is then used to adjust the 6-axes of each reticle chuck 23, 24 until an image that is the correct size, rotation and shape is produced by each projection camera 15 and 16.

Each 6-axis reticle chuck 23, 24 motion is calibrated using the position test just described, recording the location of images of slit pairs from PTR 50 while each motion of the 6-axis chuck 23 or 24 is stepped through a range of settings. The resulting data is analyzed for errors in average position in the X-axis and Y-axis, for average rotation shift, magnification changes, and keystone errors. These results can be translated into small cross-axis motion errors. A 6×6 cross-axis motion correction matrix is built from this complex set of data. Once the 6×6 cross-axis motion correction matrix is known, it is stored in the machine database and used to correct future reticle chuck motion commands. A separate 6-axis chuck motion correction matrix is built and stored for each projection camera 15, 16 and for each fine motion control loop (one using the in-column metrology sensors 63 and 64 and the other using the PSD metrology sensors 65 and 66).

Each alignment microscope, such as the right alignment microscope 37, may have significant image placement distortion. Before a microscope can be used for precise measurement of position, it should be calibrated. A laser diode 47 (FIG. 5) is provided in the stage metrology sensor to check pixel sensitivity, for example, in the right vision camera 39. The right vision camera 39 typically has a 2000×2000 pixel array. The photo-sensitivity and/or grayscale (gain) response of each pixel can vary, reducing the accuracy of the right vision camera 39. The laser diode 47 is designed to uniformly illuminate a small array of pixels in the right vision camera 39 (typically 40×40). The main stage 4 scans the laser diode 47 slowly under the right alignment microscope 37. The right vision camera 39 captures video frames each time a new block of its pixels is illuminated. Once all pixels in the right vision camera 39 have been scanned, the data is analyzed and "leveling" factors are determined, so that the grayscale response of all pixels in the right vision camera 39 can be made the same. The correction factors are stored in the machine's database and used to correct incoming pixel data prior to its analysis. This process is used to achieve maximum accuracy with the right alignment microscope 37. The same process is applied to the left alignment microscope 38. In this embodiment, where only one laser diode 47 is used, the two alignment microscopes are also matched to each other by this method.

Once the pixel response of each vision camera 39, 40 has been calibrated, the cameras 39, 40 can be used to measure position. The main stage 4 next moves an alignment cross 46a (FIG. 5) to the right alignment microscope 37. The alignment cross 46a is moved from place to place under the right alignment microscope 37 until a grid of locations has been captured by the right vision camera 39. This grid contains enough locations to accurately determine a position calibration correction function for the alignment microscope 37. A best fit 6-axis correction for X, Y, θ, magnification, keystone in the X-axis, and keystone in the Y-axis is calculated and stored in the machine database. Note that the right microscope lens 41 is telecentric at least on the substrate side, so small focus changes do not alter the position measurement accuracy. The same calibration is then repeated for the left alignment microscope 38.

Once the best focus and position setup for each alignment microscope 37, 38 is complete and each alignment microscope's video camera has been calibrated, the machine's four optical axes can be accurately located.

In one embodiment, to locate the machine's four optical axes, the two projection optical axes are first located, then the two alignment microscopes are located, and finally the relationship among the 4-optical axes is determined.

To locate the two projection optical axes, a PTR 50 is loaded onto each projection camera. Each reticle chuck is centered on its available motion. The main stage 4 moves the PTR sensor 45 to the locations needed to perform a quick calibration of each PTR's 50 image by locating in X- and Y-axes the four corner patterns and the central pattern on each PTR 50 reticle. From this set of measurements, a 6-axis calibration for each reticle chuck 23, 24 is determined, and the location of the nominal optical axis 8, 9 is determined for each of the projection cameras 15 and 16.

To locate the alignment microscope optical axes, the main stage 4 then moves the pair of alignment crosses 46a and 46b, also on the stage metrology package 14, to the right alignment microscope 37 and then to the left alignment microscope 38. While the main stage 4 is stopped at the right alignment microscope 37, the right vision camera 39 captures an image of the alignment cross 46a and 46b and computes their location in the pixel array. This is repeated for the left alignment microscope 38. At this point in the calibration sequence, the location of each alignment microscope 37, 38 and its camera pixel array is known.

Finally, the distance from each alignment microscope 37, 38 to each projection optical axis is determined. The distance from the position sensor 45 to the pair of alignment crosses 46a and 46b is known from fabrication data for the chrome on glass patterning of the stage metrology package 14. The pair of alignment crosses 46a and 46b also provide a measurement of any small rotation error in the mounting of the stage metrology package 14 on main stage 4 with respect to stage mirror 10 and/or any small rotation error that might occur during power-up. In this manner, the four optical axes are tied together by calculation.

It is possible to construct the in-stage metrology package with just one alignment cross, either 46a or 46b. In this case, some other means must be found to determine the offset in Y between position sensor 45 and the alignment cross. For example, a test wafer may be aligned, exposed, developed and examined to discover this offset. In this embodiment, this is done for every power-up or recalibration event. The preferred embodiment described earlier also requires a one-time test exposure, but then may be operated automatically without additional test wafers.

The fabrication of the chrome on glass part of the stage metrology package 14 may contain small residual errors on the order of 1-micrometer. To find this residual error, test substrates are aligned and printed. Two test substrates are loaded onto the main stage 4. The alignment microscopes 37, 38 are used to gather alignment data for the test substrates 12, 13. The substrates are then moved by the main stage 4 to the respective projection camera 15, 16 optical axes 8, 9, and an overlay test image is printed (this is usually a vernier pattern, which is well known). The test substrates are then removed from the machine, and the images are developed. The result is observed in a laboratory microscope, and any offset is determined to a tolerance of 50 to 100 nm. This offset, one for each alignment microscope, is entered manually and stored in the machine database. The offsets are then used to update subsequent automatic calibrations of the distances among the optical axes 8, 9, 68, 69. In this manner, any residual fabrication error in the glass patterning of the stage metrology package 14 is discovered, added to the machine's database, and used to find the correct relationship of each of the four optical axes 8, 9, 68, 69 to a tight tolerance.

The initial calibration of video camera pixel sensitivity and gain takes a relatively long time. The stage metrology package 14 has a quick video check pattern 48 (FIG. 5). This has a nearly uniform white surface crossed with a less-reflective grid of fine lines. When the main stage 4 positions the video check pattern 48 under each alignment microscope 37, 38, the vision camera 39, 40 can record the return signal from this pattern, look for large sensitivity response errors, if any, and update its position calibration for X, Y, θ, image size, and keystone errors.

The calibration just described is used mainly during construction or installation of the lithography machine 60. Quicker versions of each test, which use the same methods and hardware but sample fewer points, are used to perform daily checks of machine setup and optical axis 8, 9, 68, 69 locations. For example, each day best focus is checked on-axis. The data stored for the offset to the best focal plane is used to adjust the new, on-axis, best focus, Z-value to set focus at the best fit point measured earlier for the complex focal plane. For these tests, two PTR 50 reticles are loaded and aligned to the 6-axis chucks 23, 24 on each projection camera 15, 16. A quick check for optical axis location is used to locate the projection optical axes 8, 9. The main stage 4 then moves the alignment crosses 46a and 46b to each alignment microscope 37, 38, one at a time, and the vision camera 39, 40 on each alignment microscope 37, 38 captures and determines the location of the alignment crosses 46a and 46b. In this manner, the location of each alignment microscope's 37, 38 optical axis 68, 69 is updated. The control software then looks-up the manually determined offset for the relationship between the position sensor 45 and the alignment crosses 46a and 46b and computes the correct up-to-date distances between the four optical axes 8, 9, 68, 69 on the lithography machine 60. This up-to-date data is then used to properly control alignment and printing navigation during production.

Figure 3C:
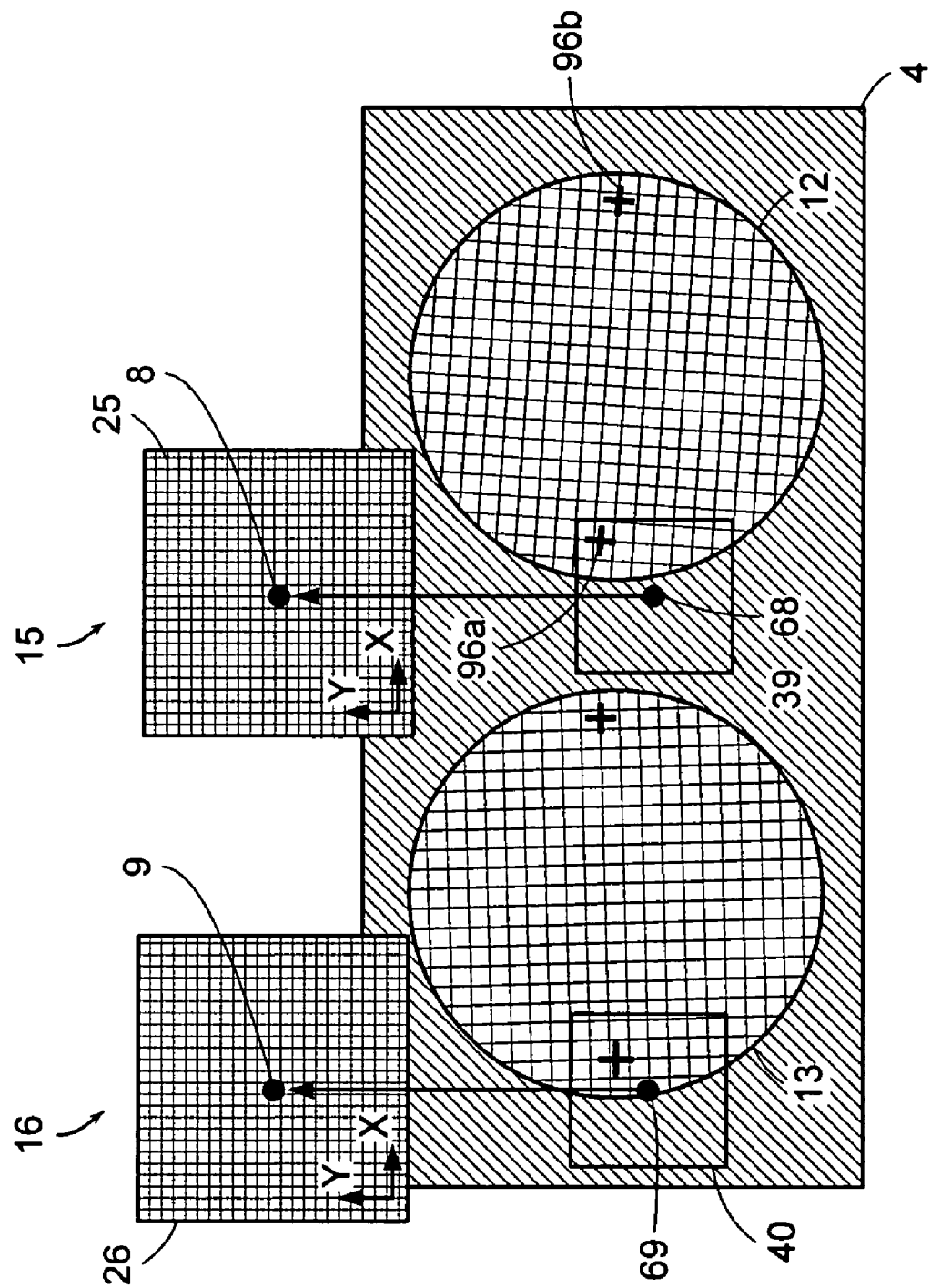
FIGS. 3C-3E are top views of the main stage carrying two substrates from (i) an alignment location (FIG. 3C) associated with the alignment microscopes of FIGS. 1 and 2 to (ii) an exposure position with the projection cameras of FIG. 1 in which the images go from unaligned (FIG. 3D) to aligned (FIG. 3E) with the substrates.
Figure 3D:
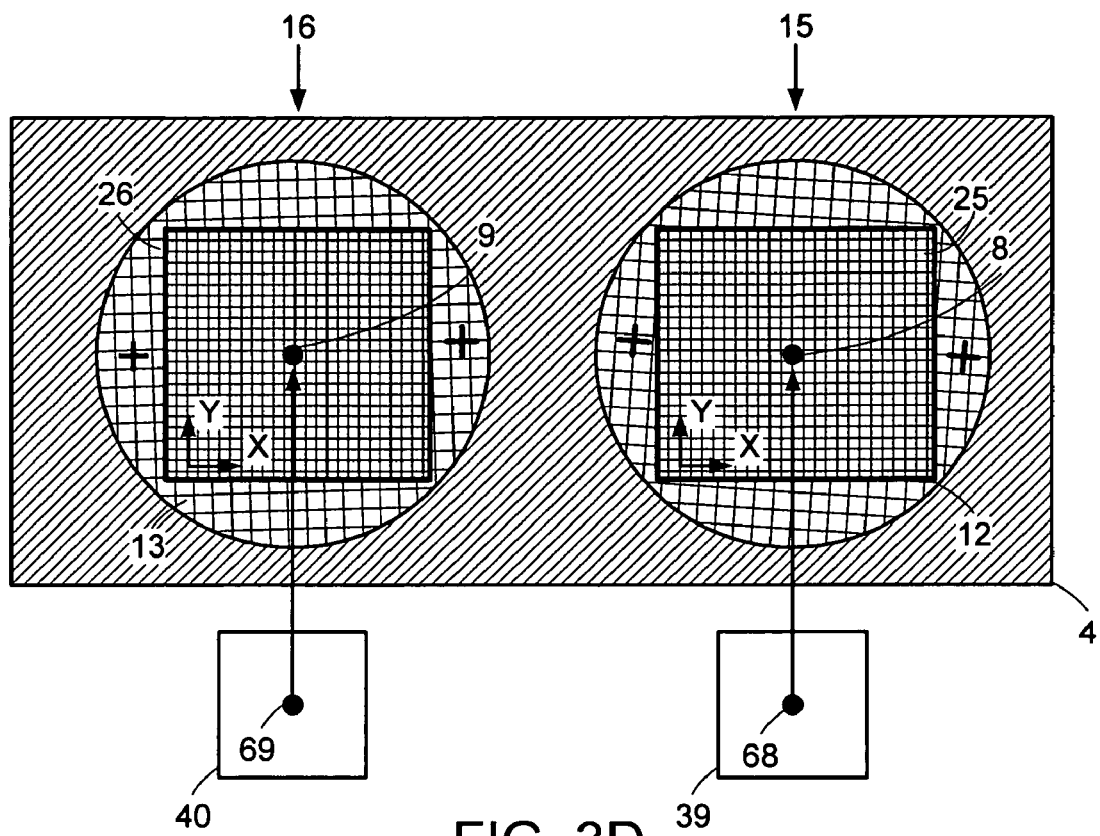
Figure 3E:
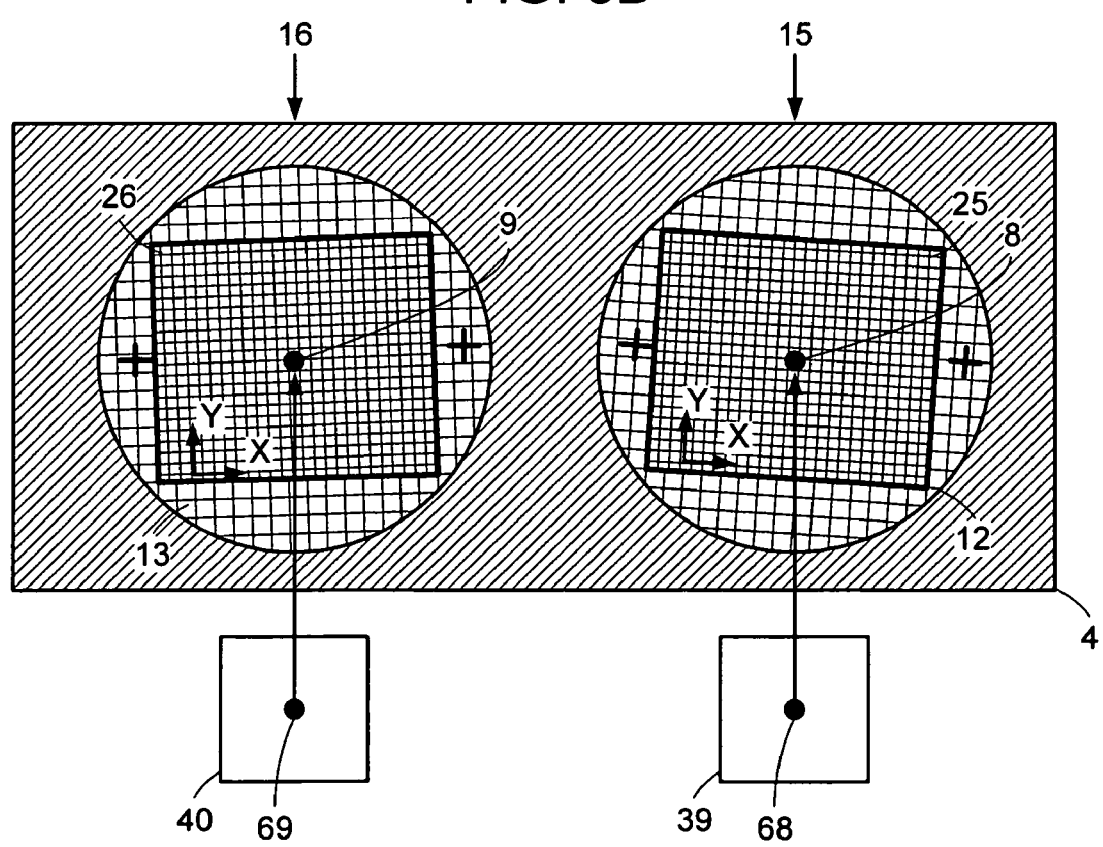

An example sequence used to align a substrate, after all calibrations have been performed, is now described in reference to FIGS. 3C-3E. The sequence for the right or left projection cameras 15 or 16 is approximately the same.

In FIG. 3C, two wafers 12, 13 are loaded onto the stage 4 with slight placement and rotation errors. The stage 4 is moved to a first alignment position. A first mark 96a on the wafer 12 appears in the field of view of the vision camera 39 (FIG. 1). The distance from the first mark 96a to the optical axis 68 (FIG. 1) is measured by the vision camera 39 and corrected to the true distance using prior data stored in a calibration database 99 (discussed later in reference to FIG. 9). The stage 4 moves to the second alignment postion (not shown), placing a second mark 96b into the vision camera 39 field of view, and a second measurement is made and corrected.

Next, the amount of stage 4 motion to the projection cameras 15 and 16 is calculated. This move uses the just-acquired position for each substrate 12 and 13 and the distance from the respective alignment microscope 37, 38 optical axis 68, 69 to the optical axis 8, 9 of the respective projection camera 15, 16. As before, the distances between optical axes are taken from the calibration database 99. As shown in FIG. 3D, this motion places the substrates 12, 13 approximately under each projected image of the respective reticles 25, 26. Fine alignment has not yet been achieved, but the remaining errors are known from prior calibration steps and current alignment calculations. So, the remaining alignment errors are eliminated by moving each reticle 25, 26 a correct amount by using the multi-axis motions of the reticle chucks 23, 24, as corrected by data retrieved from the calibration database 99. The result is shown in FIG. 3E. Note that no motion of each substrate 12, 13 relative to the stage 4 is needed in the alignment process just described.

Since the wafers 12, 13 are not rotated into alignment with the main axes of the stage 4, the reticles 25, 26 (or their images) are stepped individually in X and Y to remain in alignment with the substrates 12 and 13 as the stage 4 moves in X and Y to expose the whole wafer 12, 13 (FIGS. 3C-3E are not to scale; the actual reticle image is smaller, so successive motions of the stage 4 are needed to fully expose each substrate 12, 13).

This method of alignment may be described as "open loop" or "by the numbers". To work properly, a complex set of coordinate system relationships are established and maintained as described. This degree of complexity is needed for rapid alignment of multiple reticles to multiple substrates substantially free from moving the substrates 12, 13 relative to the stage 4.

For example, in this two camera case, the reticle chucks 23, 24 may step the reticles 25, 26 to account for X, Y, θ, and magnification errors that are typically done by the stage 4. In one embodiment, the common components can be corrected by the stage 4, and the residuals by motion of the reticles 25, 26. In another embodiment, the projected images may be aligned with the substrates 12, 13 instead of moving the reticles 25, 26, such as through motion of mirrors (not shown).

Figure 3F:
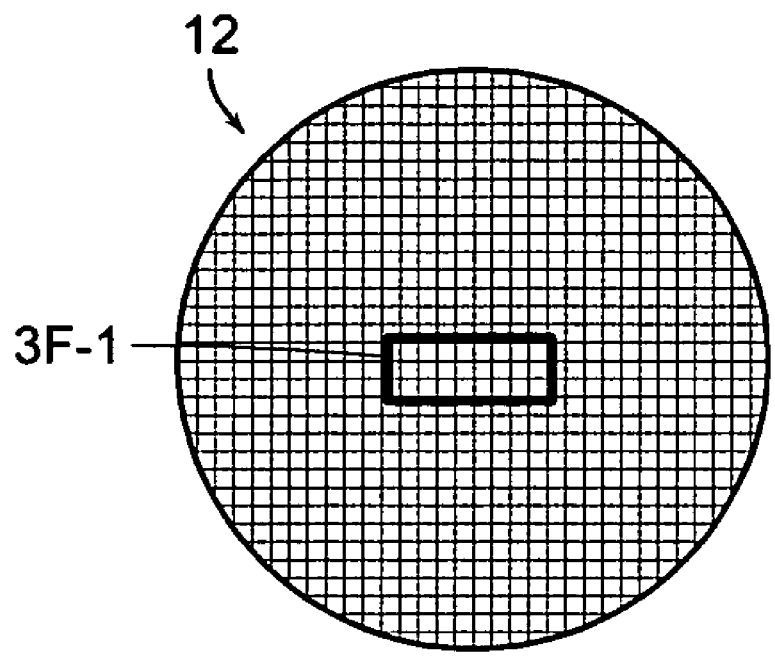
FIG. 3F is a top view of the main stage of FIG. 1 employed in a through-the-lens (TTL) embodiment.
Figures 1, 3F:
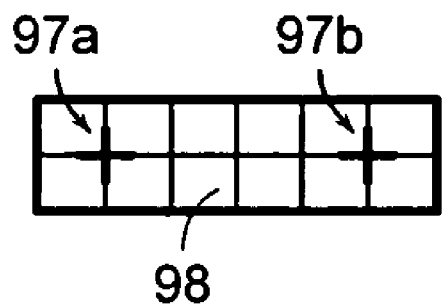

FIG. 3F illustrates an alternative embodiment having a simple, single mask/single wafer, alignment system. Observation is done directly Through-The-Lens (TTL) (i.e., projection lens). Two crosses 97a and 97b on a reticle 25 are aligned directly to the image of the wafer pattern 98. The wafer 12 and stage 4 are moved using iterative steps in X, Y and θ until alignment of the wafer pattern 98 to the reticle crosses 97 is achieved. No metrology is provided at the mask. This method may be called a "null seeking" alignment system. In most applications, the off-axis alignment system shown in FIGS. 3C-3E is preferred for optical reasons, even though it is more complex.

Note that a power failure or shutdown causes the fine coordinate relationships to be lost. On power restart, the main stage 4 moves in stepper motor mode, using the large grid motor platen 3 as a secondary reference for position, until it finds three origin sensors 51, 52 and 53 (FIG. 2). Origin sensor 51 roughly locates the main stage 4 in the X-axis while origin sensors 52, 53 roughly locate the main stage 4 in the Y-axis and θ. The main stage 4 then steps in stepper motor mode to a laser origination point on the large grid motor platen 3, where it stops, and the 3-axes of laser control are reset. While the X, Y relationship among the optical axes may not have changed, the rotational relationship of the stage mirrors 10 and 11 (FIG. 2) to the rotation axes of all four optical systems will have changed slightly. As a practical matter, it is best to run the daily calibration routines and resynchronize all axes of control at once. In this manner, the correct relationships are reestablished after a power failure or shutdown.

PTR 50 reticles may not be perfectly matched. Prior to using a pair of PTR 50 reticles, each is placed onto one calibrated projection camera, usually the right projection camera 15. A master PTR 50 reticle is used to perform the calibration of the right projection camera 15. Other PTR 50 reticles are then loaded and measured using the stage metrology package 14 and position sensor 45. But, the data collected is not used to change the calibration of the right projection camera 15. Instead, it is used to determine X, Y, θ, magnification, keystone X, and keystone Y offsets for each PTR 50 reticle. Each PTR 50 reticle has a machine readable serial number. The offsets are stored individually with each PTR 50 reticle and used as corrections for that reticle in all later calibration steps. In this manner, small variations from calibration reticle to reticle are measured and corrected. This method has proven to be superior to measuring each reticle on a coordinate measuring machine.

The methods described above for determining reticle fabrication errors, and correcting for them, is also available for all reticles used on the machine. Each production reticle 25, 26 can be placed one by one into a calibrated projection camera 15, 16, aligned to the respective 6-axis chuck 23, 24, and its offsets determined and stored in the manner just described.

Figure 9:
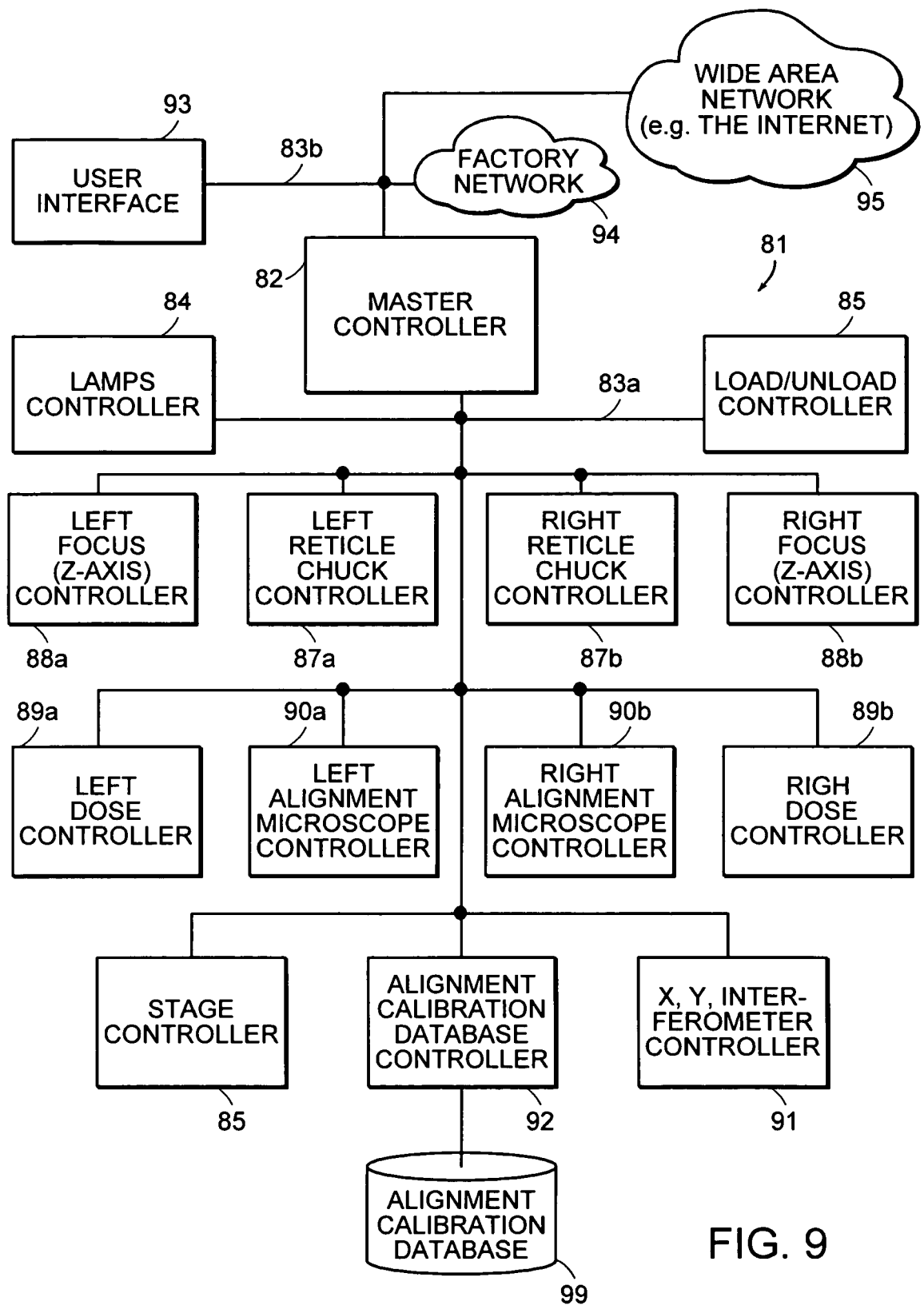
FIG. 9 is a block diagram of a distributed control system operating the lithography machine of FIG. 1.

FIG. 9 is a block diagram of an example distributed control system 81 that is used to operate the lithography machine 60 in one embodiment of the present invention. The distributed control system 81 includes a master controller 82. A first communications bus 83a connects the master controller 82 to multiple subsystem controllers 84-92. A second communications bus 83b connects the master controller 82 to a user interface 93, factory network 94, and/or Wide Area Network (WAN) 95, such as the Internet. Various communications protocols may be used by the master controller 82 in communicating with the subsystem controllers 84-92, user interface 93, and networks 94-95. The user interface 93 may be a Graphical User Interface (GUI), text-based user interface, or other human-machine interface. The user interface 93 may be connected directly to the master controller 82, as shown, or connected via one or both of the networks 94 or 95.

The subsystem controllers 84-92 include: a lamps controller 84, load/unload controller 85, stage controller 86, left reticle chuck 87a, right reticle chuck controller 87b, left focus (Z-axis) controller 88a, right focus (Z-axis) controller 88b, left dose controller 89a, right dose controller 89b, left alignment microscope controller 90a, right alignment microscope controller 90b, Interferometer controller 91, and alignment calibration database controller 92. Various bus communications protocols may be used to facilitate communications between and among the master controller 82 and subsystem controllers 84-92.

In this distributed control system 81, the subsystem controllers 84-92 receive data from the master controller 82 in the form of commands, messages, or other data types. Responsively, the subsystem controllers 84-92 control their respective subsystems. For example, the stage controller 86 may receive a command from the master controller 82 via the communications bus 83 and cause the main stage 4 to move from the load/unload area 56 (FIG. 3A) to the projection region of the projection cameras 15, 16.

The subsystem controllers 84-92 include electronics and hardware for controlling their respective subsystems. Examples of such electronics and hardware include position sensors, motion compensation processors, communications processors, motors (e.g., voice coils), and other electronics used for controlling the specific aspects of the subsystems. For example, the right reticle chuck controller 87b may include voice coil drives, position sensors, analog or digital position compensators, and other sensors or mechanisms to control multiple axes associated with the right reticle chuck 23 and right reticle 25, as described above.

The subsystem controllers 84-92 may include input/output ports and processors for communicating with the other devices on the communications bus 83. In this way, any of the subsystem controllers 84-92 may communicate with other subsystem controllers 84-92. For example, through use of an input/output port and processor, the right reticle chuck controller 87b may request and receive calibration information from the alignment calibration database controller 92. Similarly, the stage controller 86 may receive feedback from the interferometer controller 91 and cause the stage 4 to move accordingly.

In other embodiments, the distributed control system 81 may be implemented in other configurations. For example, the master controller 82 may be the only "intelligent" controller in the machine 60 but be capable of supporting each of the subsystems (e.g., main stage 4) in a manner consistent with the operations of the main stage 4. Alternatively, the subsystem controllers 84-92 may be provided in multiple Digital Signal Processors (DSPs), where fewer DSPs than controllers 84-92 may be used to implement the distributed control system 81. For example, a single DSP may be used to implement the left reticle chuck controller 87a and the right reticle chuck controller 87b in a manner that does not couple the motions of the reticle chucks 23, 24 together, such as through linear algebra decoupling techniques.

In this embodiment, the alignment calibration database controller 92 is in communication with an alignment database 99. The alignment calibration database 99 includes data collected in accordance with the calibration processes described above. The database controller 92 performs read and write operations, in this embodiment, and may use various optimized techniques for performing each. The database 99 may use a variety of formats, optionally supporting optimized storage size and retrieval operations. The database 99 may be located proximal to the database controller 92, as shown, or may be located distal from the database controller 92, such as elsewhere on the factory network 94 or the WAN 95. In the distal case, standard or customized communications protocols may be employed to facilitate communications between the database controller 92 and the database 99.

It should be understood that the subsystem controllers 84-92, or portions thereof, may be implemented in analog, digital, or hybrid micro-electronics and still be consistent with the techniques described above.

While a two substrate stage 4 has been described, it should be understood that more than two substrates 12, 13 can be put onto one stage 4 using this invention. Similarly, while two cameras 15, 16 have been described, it should be understood that more than two cameras could be used in one machine according to the principles of the present invention.

The illumination described herein is a mercury arc lamp, one for each camera 15, 16. But, laser light sources could also be used, as could other sources of exposing radiation, such as EUV or X-ray sources. These sources can be individual sources or one powerful source that is divided into separate paths, one path for each projection camera 15, 16 used.

The 6-axis chuck 23, 24 described herein uses simple position sensors to provide distance information and servo loop control feedback. Laser metered reticle stages are commonly used today in high performance step-and-scan systems. It should be understood that at least the three axes used here for X, Y, and rotation could be replaced with an interferometer system, glass scales, LVDT's, capacitance sensors, resolvers, or other measurement devices or systems without changing the principles of the present invention.

The main stage 4 described herein is controlled with a 3-axis interferometer. But, for more demanding applications, a 4-, 5-, or 6-axis set of interferometers, such as that described in U.S. Pat. No. 5,757,160, could be used and would be consistent with the principles of the present invention disclosed herein.

The grid platen 3 and stage 4 described herein could be replaced with a more conventional X, Y, θ stage that uses guideways and individual drives for X and Y without altering the principles of the present invention described herein.

It should be understood that the process, database, controllers, feedback processing, and so forth described herein may be implemented in software executed by general purpose or application specific processor(s). The software may be stored locally on magnetic or optical disk, RAM, ROM, or stored remotely and downloaded to the processor(s) via a communication network. During operation, the processor(s) load and execute the software. The software, or portions thereof, may also be written as firmware onto a suitable electronics component and executed at run-time accordingly.

While this invention has been particularly shown and described with references to preferred embodiments thereof, it will be understood by those skilled in the art that various changes in form and details may be made therein without departing from the scope of the invention encompassed by the appended claims.

What is claimed is:

1. A lithography machine, comprising:
    at least two projection cameras positioned to project images from respective image sources onto a first substrate and a second substrate simultaneously, each projection camera including an independent, multi-axis, alignment system that aligns the respective image with the respective substrate to correct for at least four alignment errors independent of moving a projection optic; and
    a stage to (i) carry the first and second substrates and (ii) to move relative to the projection cameras.

2. The lithography machine according to claim 1 further including a controller that coordinates motion of the images and stage, free from moving the first or second substrate with respect to the stage, to align and overlay the projected images on the first and second substrates from the respective projection cameras.

3. The lithography machine according to claim 2 wherein the controller causes the multi-axis alignment system to compensate for alignment differences between the first and second substrates on the stage.

4. The lithography machine according to claim 1 wherein the alignment system includes an independent, multi-axis alignment mechanism that moves the respective image independently relative to the respective substrate to correct for an alignment error between the respective image source and the respective substrate.

5. The lithography machine according to claim 1 wherein each multi-axis alignment system includes an independent focus mechanism that focuses the image projected by the respective projection camera.

6. The lithography machine according to claim 1 wherein the multi-axis alignment systems move the image sources in six axes.

7. The lithography machine according to claim 1 wherein the multi-axis alignment systems move the image sources in at least two axes to correct for at least one of the following errors: X, Y, Θ, image size, or keystone errors.

8. The lithography machine according to claim 7 wherein each multi-axis alignment mechanism includes a position sensor subsystem in each axis of motion.

9. The lithography machine according to claim 7 wherein each multi-axis alignment system is calibrated prior to being used to project an image onto the respective substrate.

10. The lithography machine according to claim 7 wherein each multi-axis alignment system includes a travel range sufficient to move the projected image at least about +/−1.25 mm on the respective substrate in an X- or Y-axis.

11. The lithography machine according to claim 1 wherein the multi-axis alignment systems include an alignment sensor used to determine a position of a substrate on the stage.

12. The lithography machine according to claim 11 wherein the alignment sensor is an alignment microscope.

13. The lithography machine according to claim 1 wherein the multi-axis alignment systems include at least one stage metrology package located on the stage in a position observable by the alignment systems.

14. The lithography machine according to claim 13 wherein the alignment systems are adapted to determine alignment between the respective projection cameras and the stage through observation of the at least one stage metrology package.

15. The lithography machine according to claim 13 wherein the at least one stage metrology package includes multiple patterns observable by the multi-axis alignment systems.

16. The lithography machine according to claim 13 wherein the at least one stage metrology package is shared by the multi-axis alignment systems.

17. The lithography machine according to claim 1 wherein the image sources include a mask.

18. The lithography machine according to claim 1 wherein the image sources include mechanisms that dynamically generate a mask.

19. The lithography machine according to claim 1 wherein each projection camera further includes a shutter controlled by a dose control system to expose the respective substrate to the projected image for a controlled amount of time.

20. The lithography machine according to claim 19 wherein the stage remains stationary until the shutters close.

21. The lithography machine according to claim 1 wherein the multi-axis alignment systems include (a) an auto-focus detector, (b) a multi-axis reticle chuck that holds a reticle that includes the image source, and (c) an alignment microscope and camera coupled to image processing software, wherein:
    (i) the multi-axis alignment systems include a focus control mechanism that moves the respective projection camera in an axis to correct for a focus error as determined by the autofocus detector and (ii) the multi-axis alignment systems include mechanisms that move the multi-axis reticle chuck in multiple axes to correct for alignment errors as determined by the image processing software through comparison of current alignment images taken by the alignment microscope and previously determined calibration data associated with the multi-axis reticle chuck.

22. The lithography machine according to claim 1 wherein the multi-axis alignment systems include voice coils and flexures.

23. The lithography machine according to claim 1 wherein the multi-axis alignment systems include ceramic actuators.

24. The lithography machine according to claim 1 wherein the stage includes multiple surfaces supporting stage position measurements.

25. The lithography machine according to claim 24 wherein the multiple surfaces are mirrors that reflect optical beams.

26. The lithography machine according to claim 25 wherein the optical beams include at least one first optical beam along a first axis and at least two second optical beams along a second axis.

27. The lithography machine according to claim 26 wherein the two second optical beams are approximately spaced apart at least the same distance as the projection cameras.

28. The lithography machine according to claim 1 wherein the stage is driven by multiple motors, wherein at least two motors are driven differentially.

29. The lithography machine as claimed in claim 1, wherein the stage is adapted to move relative to the projection cameras in a controlled manner.

30. The lithography machine as claimed in claim 1 wherein the independent multi-axis alignment system that aligns the respective image with the respective substrate corrects for at least a fifth alignment error.

31. The lithography machine as claimed in claim 30 wherein the independent multi-axis alignment system that aligns the respective image with the respective substrate corrects for at least a sixth alignment error.

32. The lithography machine as claimed in claim 1 wherein the multi-axis alignment system corrects for at least a fifth alignment error being at least one of a magnification error or a keystone error.

33. A method for printing onto substrates, the method comprising:
    positioning a first substrate and a second substrate in a projection region of at least two projection cameras adapted to project respective images from image sources onto respective substrates;
    moving the images independently relative to the respective substrates to correct for at least four alignment errors between the image sources and the respective substrates independent of moving a projection optic;
    carrying the first and second substrates on a stage; and
    moving the stage relative to the projection cameras.

34. The method according to claim 33 further including causing motion of the images and stage, free from moving the first or second substrate with respect to the stages, to align and overlay the projected images on the substrates from the respective projection cameras.

35. The method according to claim 34 wherein moving the images independently includes compensating for alignment differences between the first and second substrates on the stage.

36. The method according to claim 33 wherein aligning the images with the respective substrates includes moving the images independently relative to the respective substrates to correct for alignment errors between the image sources and the respective substrates.

37. The method according to claim 33 wherein aligning the images includes independently focusing the projection cameras.

38. The method according to claim 33 wherein aligning the images includes adjusting the image sources in six axes.

39. The method according to claim 33 wherein aligning the images includes adjusting the image sources in at least two axes to correct for at least one of the following errors: X, Y, θ, image size, or keystone errors.

40. The method according to claim 39 wherein aligning the images includes sensing a position in each axis of motion.

41. The method according to claim 39 further including calibrating each of the projection cameras in multiple axes prior to projecting the images onto the first and second substrates.

42. The method according to claim 39 further including causing the projected images to travel in a range at least about +/−1.25 mm in an X-axis or Y-axis on respective first and second substrates.

43. The method according to claim 33 wherein aligning the images includes sensing positions of the substrates on the stage.

44. The method according to claim 43 wherein sensing positions of the substrates on the stage includes viewing the substrates with independent alignment microscopes.

45. The method according to claim 33 wherein aligning the images includes observing at least one stage metrology package located on the stage.

46. The method according to claim 45 wherein aligning the images includes determining alignment between the respective projection cameras and the stage through observing multiple patterns on the stage metrology package.

47. The method according to claim 33 further including masking the image sources.

48. The method according to claim 33 further including dynamically generating a mask associated with the image sources.

49. The method according to claim 33 further including controlling an amount of time the first and second substrates are exposed to the respective images.

50. The method according to claim 49 wherein positioning the first and second substrates beneath the at least two projection cameras includes maintaining the position of the first and second substrates until exposure to the respective images is completed.

51. The method according to claim 33 wherein moving the images includes correcting focus error at each of the projection cameras independently and correcting for alignment errors based on a comparison of current alignment images compared to previously determined calibration data.

52. The method according to claim 33 wherein moving the images includes controlling the position of the image sources in a frictionless manner.

53. The method according to claim 33 further including:
    measuring the position of the stage supporting the substrates; and aligning the images to the substrates as a function of the measurements.

54. The method according to claim 53 wherein the measuring includes optically measuring the position of multiple surfaces of the stage.

55. The method according to claim 54 wherein optically measuring the position of multiple surfaces of the stage includes measuring phase characteristics of at least one first optical beam along a first axis and phase characteristics of at least two second optical beams along a second axis.

56. The method according to claim 55 wherein the two second optical beams are approximately spaced apart at least the same distance as the substrates.

57. The method according to claim 33 further including differentially driving multiple motors in the stage.

58. The method as claimed in claim 33 further comprising correcting for at least a fifth or sixth alignment error.

59. The method as claimed in claim 58 further comprising correcting for at least one of a magnification error, or a keystone error.

60. A lithography machine, comprising:
    means for projecting images onto at least two substrates simultaneously;

means for correcting for at least four alignment errors between each projection means and respective ones of the at least two substrates in a manner substantially free from moving the at least two substrates and independent of moving the means for projecting images;

means for carrying the at least two substrates; and means for moving the at least two substrates relative to the projection means.

61. A lithography machine, comprising:

a projection camera including a reticle chuck adapted to hold a reticle having a pattern to be projected as an image onto a substrate;

a multi-axis alignment system that moves the image in multiple directions;

a stage to carry the substrate and move the substrate relative to the projection camera;

an alignment sensor system adapted to measure a position of the substrate relative to the stage for use in projecting the image onto the substrate; and an alignment controller coupled to the stage, alignment sensor system, and multi-axis alignment system that causes the stage to position the substrate in a projection region of the camera for gross alignment and causes the multi-axis alignment system to move the image relative to the substrate for fine alignment to correct for at least four alignment errors independent of moving a projection optic each time the stage moves in the projection region.

62. The lithography machine according to claim 61 wherein the alignment sensor system is adapted to measure a position of the stage relative to the projection camera.

63. The lithography machine according to claim 61 wherein the alignment sensor system measures the position of the substrate in a projection region of the projection camera.

64. The lithography machine according to claim 61 wherein the alignment controller causes the multi-axis alignment system to align the image relative to the substrate in an open-loop manner.

65. The lithography system according to claim 61 wherein the alignment controller causes the multi-axis alignment system to align the image relative to the substrate in a closed-loop manner.

66. The lithography machine according to claim 61 wherein the alignment sensor system captures images of patterns on the substrate for processing by the alignment controller.

67. The lithography machine according to claim 61 wherein the multi-axis alignment system causes the reticle chuck to move the reticle in at least two axes of motion.

68. The lithography machine according to claim 61 wherein the projection camera is coupled to a focus control system that moves the projection camera in a manner that focuses the projected image on the substrate.

69. The lithography machine according to claim 61 wherein the projection camera includes a shutter coupled to a dose control system that controls exposure time of the substrate to the projected image.

70. The lithography machine according to claim 61 further including (i) another projection camera with a respective reticle chuck supporting a respective reticle that projects an image onto another substrate simultaneously with the other projection camera projecting a respective image onto its respective substrate, (ii) another alignment sensor system that senses a position of the respective substrate, and (iii) another alignment controller that aligns the respective reticle with the respective substrate independently.

71. The lithography machine as claimed in claim 61 wherein the multi-axis alignment system corrects for at least a fifth or a sixth alignment error, and wherein the fifth or the sixth alignment error is a magnification error or a keystone error.

72. A method for printing on a substrate, the method comprising:

providing a reticle having a pattern to be projected as an image onto a substrate in optical exposure relation with a projection camera;

moving the substrate into gross alignment with the reticle as imaged in a projection region of the projection camera;

determining a position of the substrate relative to the stage for use in projecting the image onto the substrate; and moving the image in multiple axes to align the image in fine alignment to correct for at least four alignment errors independent of moving a projection optic with the substrate each time the substrate is moved in the projection region; and projecting the pattern onto the substrate.

73. The method according to claim 72 wherein determining an alignment error between the reticle and the substrate includes measuring a position of a stage carrying the substrate relative to the projection camera.

74. The method according to claim 72 wherein determining an alignment error between the reticle and the substrate includes measuring the position of the substrate in a projection region of the projection camera.

75. The method according to claim 72 wherein moving the image is done in an open-loop manner.

76. The method according to claim 72 wherein moving the image is done in a closed-loop manner.

77. The method according to claim 72 further including capturing images of patterns on a stage moving the substrate and processing the images to determine an alignment error between the reticle and the substrate.

78. The method according to claim 72 wherein aligning the image relative to the substrate includes moving the reticle in at least two axes of motion.

79. The method according to claim 72 further including focusing the projected image.

80. The method according to claim 72 further including controlling an exposure time of the substrate to the projected image.

81. The method according to claim 72 further including independently and simultaneously aligning multiple images, produced by multiple reticles, with multiple substrates to expose the multiple substrates to respective images simultaneously.

82. The method as claimed in claim 72 further comprising correcting for at least one of a fifth alignment error, or a sixth alignment error, and wherein at least one of the fifth and sixth alignment error is a magnification error or a keystone error.

83. A lithography machine, comprising:

means for moving a substrate into gross alignment with a reticle as imaged in a projection region of the projection camera, the reticle including a pattern to be projected as an image onto the substrate;

means for sensing a position of the substrate relative to the stage for use in projecting the image onto the substrate; and means for fine aligning the image with the substrate each time the substrate is moved in the projection region to correct for at least four alignment errors independent of moving a projection optic; and means for projecting the pattern onto the substrate.

84. A lithography machine, comprising:
first and second projection cameras that project images from first and second reticles onto first and second substrates, respectively, the projection cameras including respective alignment systems;
first and second reticle chucks configured to move respective reticles in at least one z-axis to adjust magnification of the projected images;
first and second alignment microscopes that detect alignment patterns associated with the respective substrates; and
at least one alignment compensation controller coupled to outputs of the first and second alignment microscopes that cause the alignment systems to move the images relative to the substrates based on the detected alignment patterns received from the alignment microscopes to correct for at least four alignment errors independent of moving a projection optic.

85. The lithography machine according to claim 84 wherein the alignment systems determine a location of a stage carrying the substrates relative to the projection cameras through a lens of the respective projection cameras.

86. The lithography machine according to claim 84 wherein the alignment systems determine a location of a stage carrying the substrates off-axis from the projection cameras and observe a metrology package associated with the stage to determine the location of the stage relative to the projection cameras.

87. The lithography machine according to claim 84 wherein the first and second alignment microscopes operate independently.

88. The lithography machine according to claim 84 further including first and second auto-focus sensors mechanically coupled to respective alignment microscopes that provide signals to the at least one alignment compensation controller to cause the respective alignment microscope to remove focus error associated with the alignment patterns.

89. The lithography machine according to claim 84 wherein the first and second alignment microscopes provide images to the at least one alignment compensation controller causing respective projection cameras to remove respective focus errors associated with the images on the substrates.

90. The lithography machine according to claim 84 wherein the first and second reticle chucks are configured to move respective reticles in a z-axis to adjust (i) magnification of the projected images and (ii) tipping and tilting alignment between the reticles and projection optics of the respective projection cameras.

91. The lithography machine according to claim 84 wherein the first and second reticle chucks are six-axis reticle chucks.

92. The lithography machine as claimed in claim 84 wherein the alignment system corrects for at least one of a fifth or a sixth alignment error, and wherein at least one of the fifth or sixth alignment error is a magnification error or a keystone error.

93. A method for printing onto substrates, the method comprising:
projecting first and second images from first and second reticles onto first and second substrates, respectively;
moving first and second reticles in at least one z-axis to adjust magnification of the projected images;
detecting first and second alignment patterns associated with the respective first and second substrates; and
causing the first and second images to move relative to the first and second substrates based on the detected alignment patterns to correct for at least four alignment errors independent of moving a projection optic.

94. The method according to claim 93 wherein projecting the first and second images onto the first and second substrates includes determining a location of a stage carrying the substrates through a lens of projection cameras projecting the images.

95. The method according to claim 93 wherein projecting the first and second images onto the first and second substrates includes determining locations of a stage carrying the substrates off-axis from projection cameras projecting the images and observing a metrology package associated with the stage to determine the position of the stage relative to the projection cameras.

96. The method according to claim 93 wherein detecting first and second alignment patterns occur independently.

97. The method according to claim 93 further including, based on the detected alignment patterns, independently removing focus errors associated with detecting the first and second alignment patterns.

98. The method according to claim 93 further including, based on the detected first and second alignment patterns, removing respective focus errors associated with the first and second images on the first and second substrates.

99. The method according to claim 93 wherein moving first and second reticles in the z-axis includes moving first and second reticles in the z-axis to adjust (i) magnification of the projected images and (ii) tipping and tilting alignment between the reticles and projection optics of the respective projection cameras.

100. The method as claimed in claim 93 further comprising causing the images to move to correct for at least one of a fifth or sixth alignment error, and wherein the fifth or sixth alignment error is a magnification error or a keystone error.

101. A lithography machine, comprising:
means for aligning and projecting images from at least two reticles onto at least two respective substrates simultaneously;
means for moving respective reticles in at least one z-axis to adjust magnification of the projected images;
means for detecting alignment patterns associated with each of the at least two substrates; and
means for moving the projected images relative to the substrates based on the detected alignment patterns to correct for at least four alignment errors independent of moving a projection optic.

102. The lithography machine as claimed in claim 101 wherein the means for moving the projected images corrects for at least one of a fifth or a sixth alignment error, and wherein at least one of the fifth or sixth alignment error is a magnification error or a keystone error.

* * * * *